(12) United States Patent
Saitoh et al.

(10) Patent No.: US 12,029,083 B2
(45) Date of Patent: Jul. 2, 2024

(54) DISPLAY DEVICE

(71) Applicant: SHARP KABUSHIKI KAISHA, Sakai (JP)

(72) Inventors: Takao Saitoh, Sakai (JP); Masahiko Miwa, Sakai (JP); Masaki Yamanaka, Sakai (JP); Yohsuke Kanzaki, Sakai (JP); Seiji Kaneko, Sakai (JP); Yi Sun, Sakai (JP)

(73) Assignee: SHARP KABUSHIKI KAISHA, Sakai (JP)

( * ) Notice: Subject to any disclaimer, the term of this patent is extended or adjusted under 35 U.S.C. 154(b) by 656 days.

(21) Appl. No.: 17/276,419

(22) PCT Filed: Sep. 21, 2018

(86) PCT No.: PCT/JP2018/035119
§ 371 (c)(1),
(2) Date: Mar. 15, 2021

(87) PCT Pub. No.: WO2020/059125
PCT Pub. Date: Mar. 26, 2020

(65) Prior Publication Data
US 2022/0037449 A1    Feb. 3, 2022

(51) Int. Cl.
*H10K 59/131*  (2023.01)
*H10K 71/00*  (2023.01)
*H10K 59/12*  (2023.01)

(52) U.S. Cl.
CPC ........... *H10K 59/131* (2023.02); *H10K 71/00* (2023.02); *H10K 59/1201* (2023.02)

(58) Field of Classification Search
CPC .. H10K 59/131; H10K 71/00; H10K 59/1201; H10K 59/123; H10K 59/1213; H10K 59/124
See application file for complete search history.

(56) References Cited

U.S. PATENT DOCUMENTS

| | | | |
|---|---|---|---|
| 6,115,088 A | * | 9/2000 | Zhang .............. G02F 1/136227 349/111 |
| 6,512,504 B1 | | 1/2003 | Yamauchi et al. |
| 10,840,269 B2 | * | 11/2020 | Okabe ............... H10K 59/1213 |
| 2003/0132900 A1 | | 7/2003 | Yamauchi et al. |
| 2005/0184936 A1 | | 8/2005 | Yamauchi et al. |
| 2008/0018566 A1 | | 1/2008 | Yamauchi et al. |
| 2011/0090209 A1 | | 4/2011 | Yamauchi et al. |
| 2015/0187822 A1 | | 7/2015 | Yamauchi et al. |

(Continued)

FOREIGN PATENT DOCUMENTS

JP   2009123261 A  *  6/2009  ............. G11C 17/06
JP   2017173835 A      9/2017

*Primary Examiner* — Fernando L Toledo
*Assistant Examiner* — Marshall Mu-Nuo Hatfield
(74) *Attorney, Agent, or Firm* — ScienBiziP, P.C.

(57) ABSTRACT

A first metal layer that is formed by a first metal film is provided in an island shape along a pair of third wiring lines that is adjacent to each other. The first metal layer overlaps a region that is surrounded by a pair of first wiring lines, among several first wiring lines extending parallel to each other and formed by a first metal film, that is adjacent to each other, and the pair of third wiring lines, among several third wiring lines extending parallel to each other and in a direction intersecting each of the several first wiring lines.

20 Claims, 22 Drawing Sheets

(56) References Cited

U.S. PATENT DOCUMENTS

| | | |
|---|---|---|
| 2016/0197105 A1 | 7/2016 | Yamauchi et al. |
| 2018/0107078 A1* | 4/2018 | Ishigaki .............. H01L 27/1222 |
| 2019/0172884 A1* | 6/2019 | Shim .................... H10K 59/123 |
| 2021/0005842 A1* | 1/2021 | Takahashi ................. G09F 9/30 |
| 2021/0013296 A1* | 1/2021 | Ochi .................... H10K 59/131 |
| 2021/0050395 A1* | 2/2021 | Okabe ................. H10K 59/122 |
| 2021/0057511 A1* | 2/2021 | Saitoh ....................... G09F 9/00 |

\* cited by examiner

DISPLAY DEVICE

TECHNICAL FIELD

The disclosure relates to a display device.

BACKGROUND ART

In recent years, organic EL display devices in which organic electroluminescence (EL) elements are used and that are of a self-luminous type have attracted attention as a display device that can replace a liquid crystal display device. In the organic EL display device, for example, a plurality of source lines is provided so as to extend parallel with each other in a display region for displaying an image.

For example, PTL 1 discloses a semiconductor device that includes a plurality of pixels each having an EL element, a first transistor electrically connected to the EL element, a second transistor electrically connected to a source line, and a holding capacitor, in which the first transistor functions as a switching element and the second transistor functions to control the amount of current flowing from a current supply line to the EL element.

CITATION LIST

Patent Literature

PTL 1: JP 2017-173835 A

SUMMARY

Technical Problem

Incidentally, in an organic EL display device, the distances between a plurality of source lines are shortened for high definition. Thus, after forming the plurality of source lines, a rework process may be performed in which a belt-shaped resist pattern is formed so as to cover respective source lines and etching is performed through the resist pattern to remove the film residue of the conductive film between the source lines. However, in the rework process, when the resist material is applied so as to cover each source line, the coating film (resist film) made of the resist material is formed relatively thinly on respective source lines, while being relatively thick between the respective source lines. Thus, due to the shortage of exposure amount, the film residue of the resist film may remain between the respective source lines. In that case, when there is the film residue of the conductive film between the source lines and there is the film residue of the resist film on the film residue of the conductive film, it becomes difficult to remove the film residue of the conductive film. Thus, the effect of the rework process is reduced.

The disclosure has been made in view of the above, and an object of the disclosure is to suppress the remaining of the residue of the resist film between wiring lines.

In order to achieve the object described above, a display device according to the disclosure includes a base substrate, a TFT layer provided on the base substrate and formed by sequentially layering a first inorganic insulating film, a first metal film, a second inorganic insulating film, a second metal film, a third inorganic insulating film, and a third metal film, a light-emitting element provided on the TFT layer and included in a display region, a plurality of first wiring lines provided by the first metal film in a state of extending in parallel to each other in the display region, a plurality of second wiring lines provided by the second metal film in a state of extending in parallel to each other in an extending direction of each of the plurality of first wiring lines in the display region, a plurality of third wiring lines provided by the third metal film in a state of extending in parallel to each other in a direction intersecting each of the plurality of first wiring lines in the display region, in which in a state of overlapping a region surrounded by a pair of third wiring lines adjacent to each other among the plurality of third wiring lines and a pair of first wiring lines adjacent to each other among the plurality of first wiring lines, a first metal layer formed by the first metal film is provided in an island shape along the pair of third wiring lines adjacent to each other.

Advantageous Effects of Disclosure

According to the disclosure, the first metal layer that is formed by the first metal film is provided in an island shape along the pair of third wiring lines that is adjacent to each other. The first metal layer overlaps the region that is surrounded by the pair of third wiring lines adjacent to each other and the pair of first wiring lines adjacent to each other, and the remaining of the resist film residue between the wiring lines can be suppressed.

DESCRIPTION OF EMBODIMENTS

Embodiments of the disclosure will be described below in detail with reference to the drawings. Note that the disclosure is not limited to the embodiments to be described below.

First Embodiment

Figure 1:
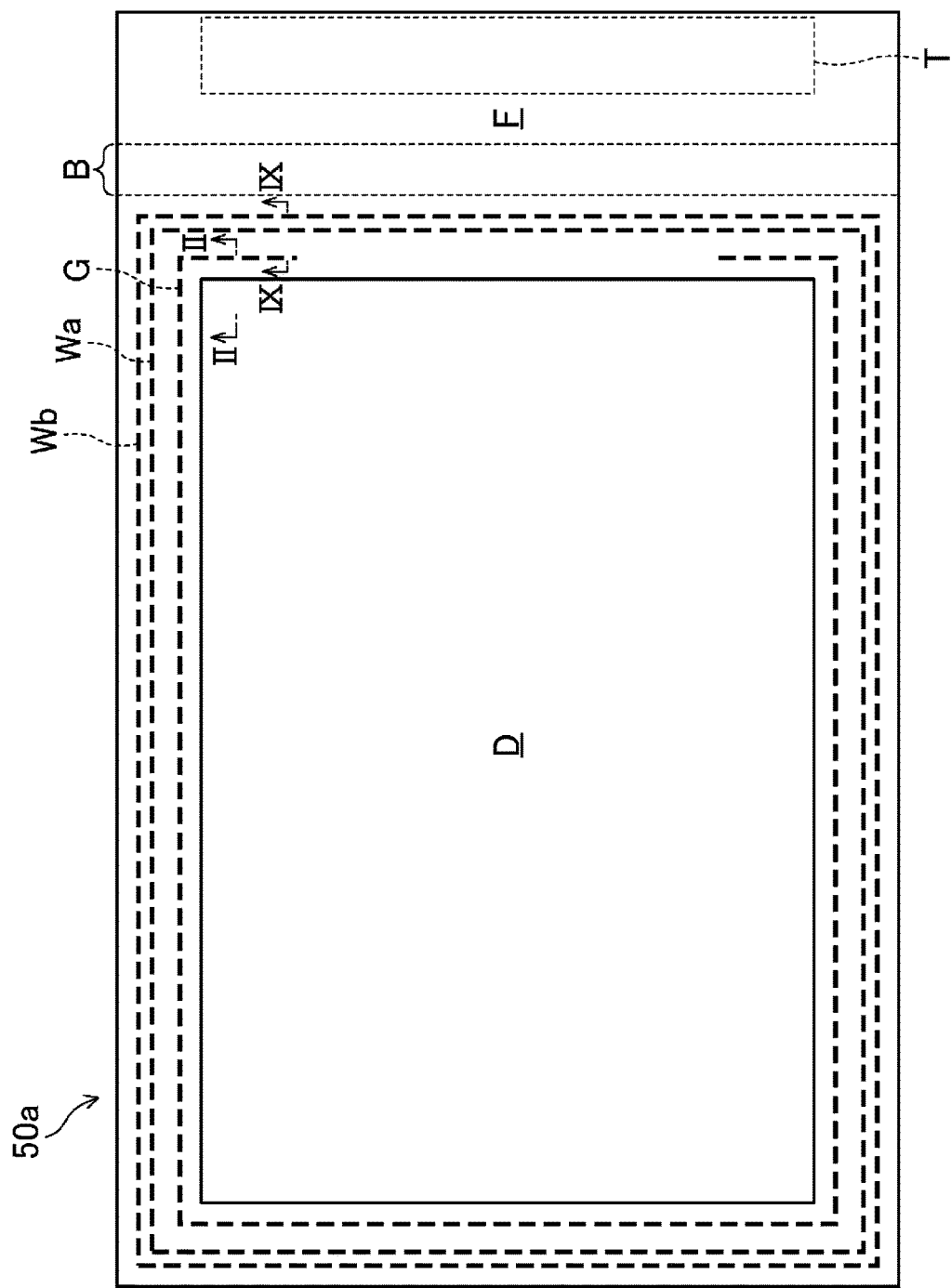
FIG. 1 is a plan view illustrating a schematic configuration of an organic EL display device according to a first embodiment of the disclosure.
Figure 2:
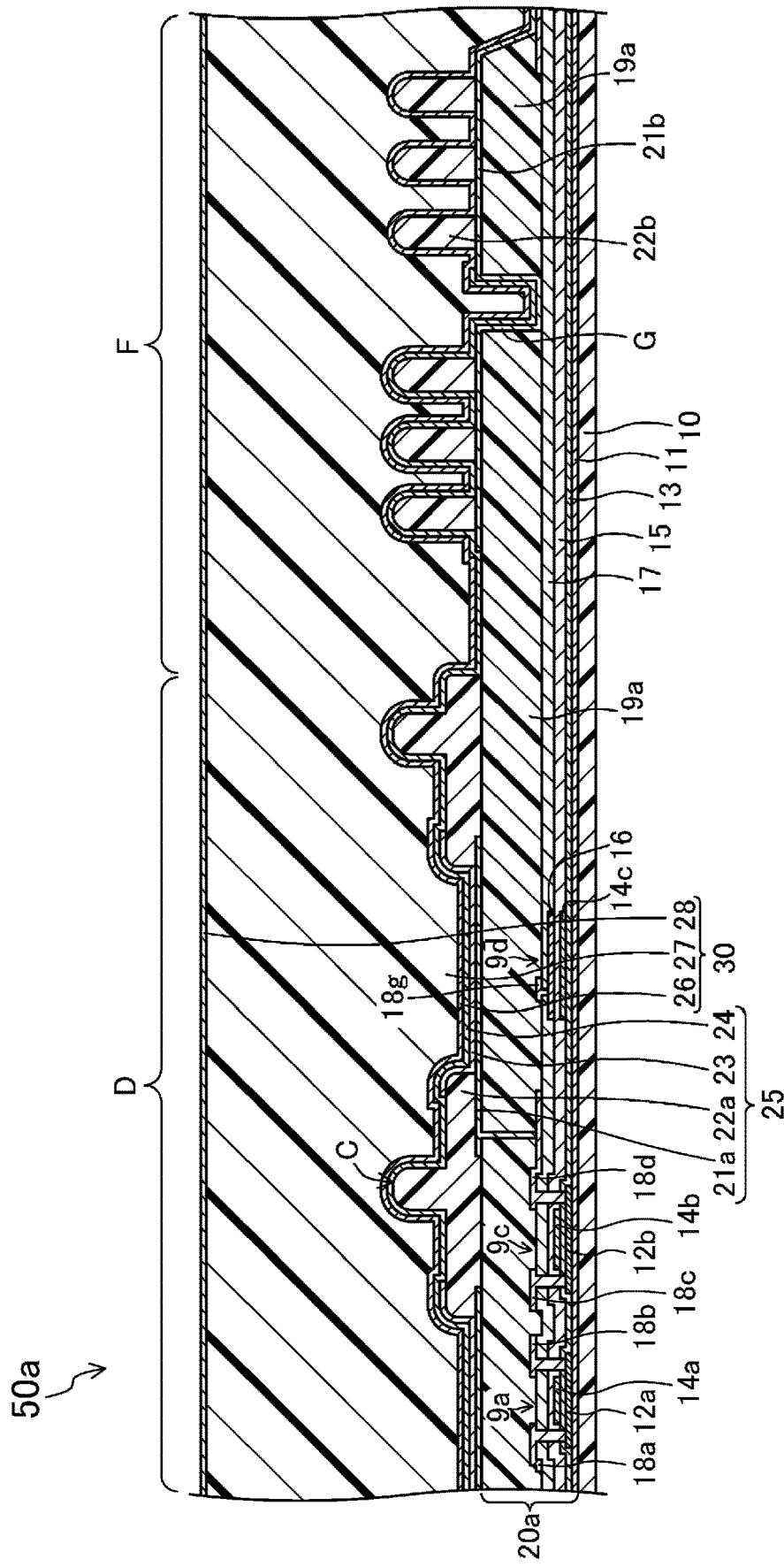
FIG. 2 is a cross-sectional view of the organic EL display device taken along a line II-II in FIG. 1.
Figure 3:
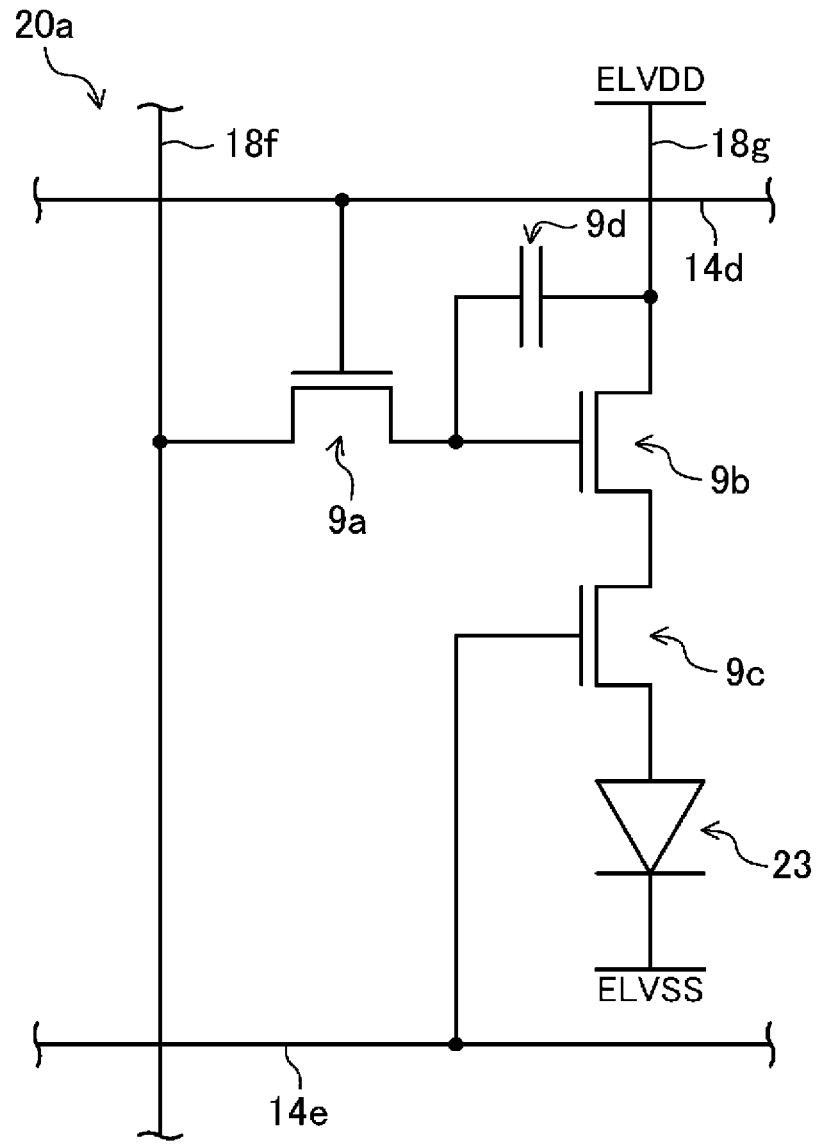
FIG. 3 is an equivalent circuit diagram of a TFT layer included in the organic EL display device according to the first embodiment of the disclosure.
Figure 4:
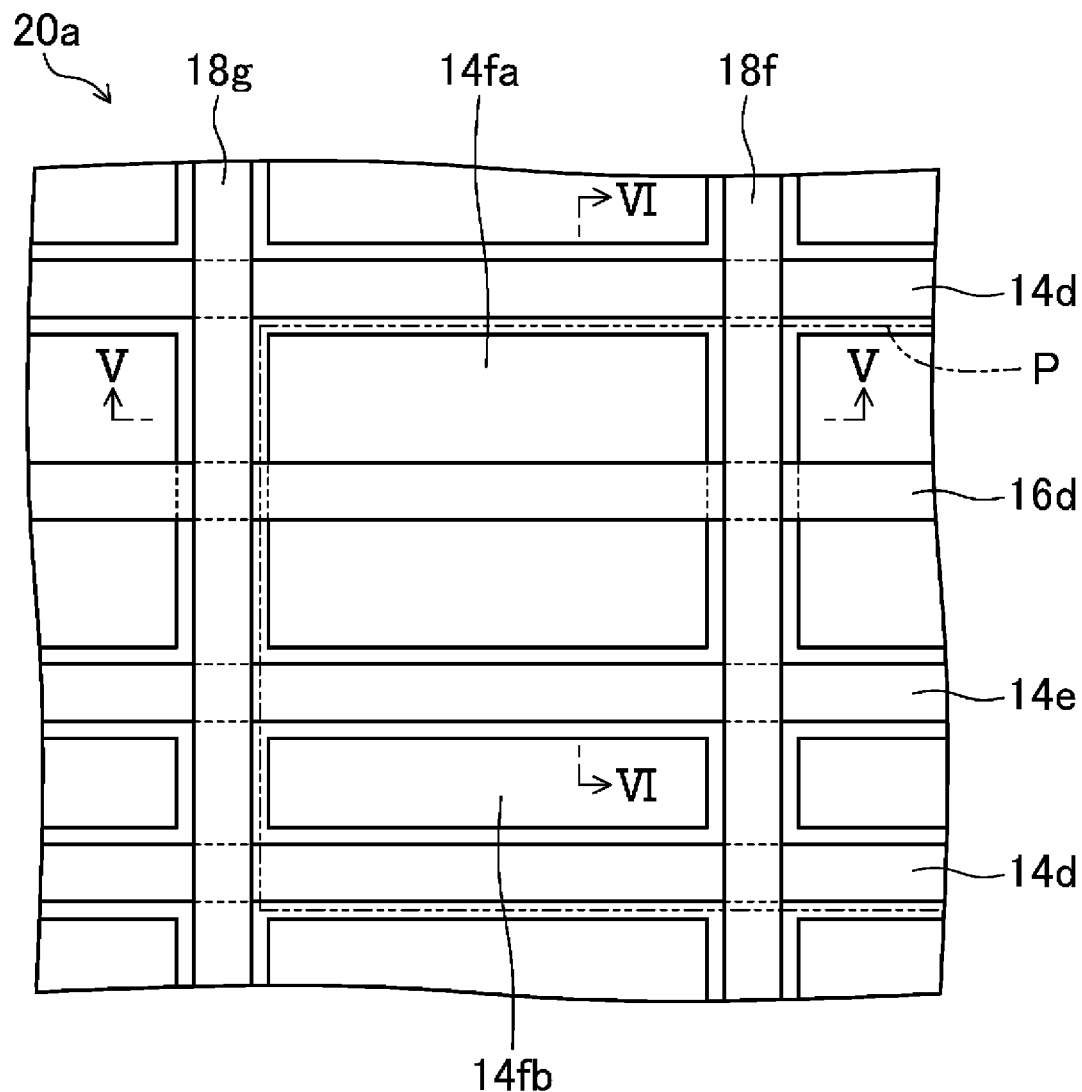
FIG. 4 is a plan view of the TFT layer included in the organic EL display device according to the first embodiment of the disclosure.
Figure 5:
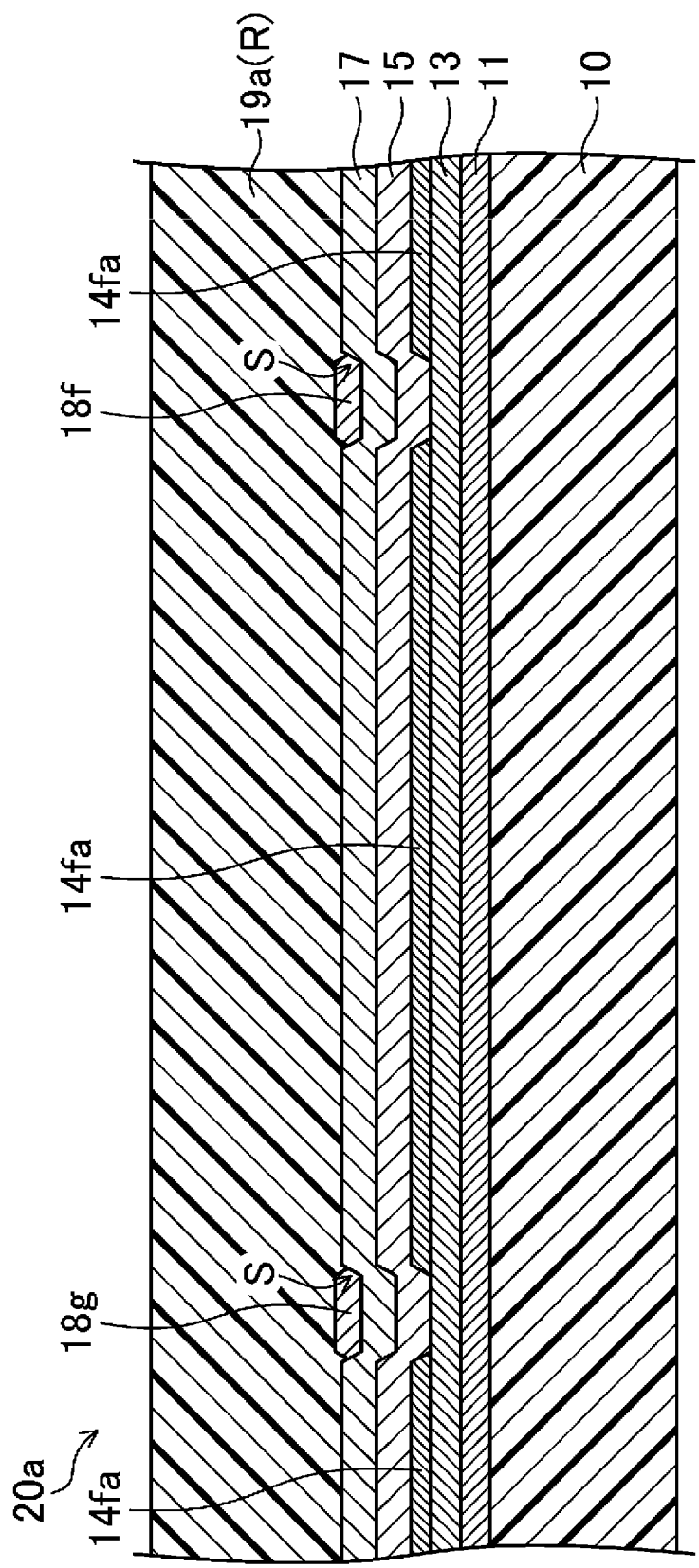
FIG. 5 is a cross-sectional view of the TFT layer taken along a line V-V in FIG. 4.
Figure 6:
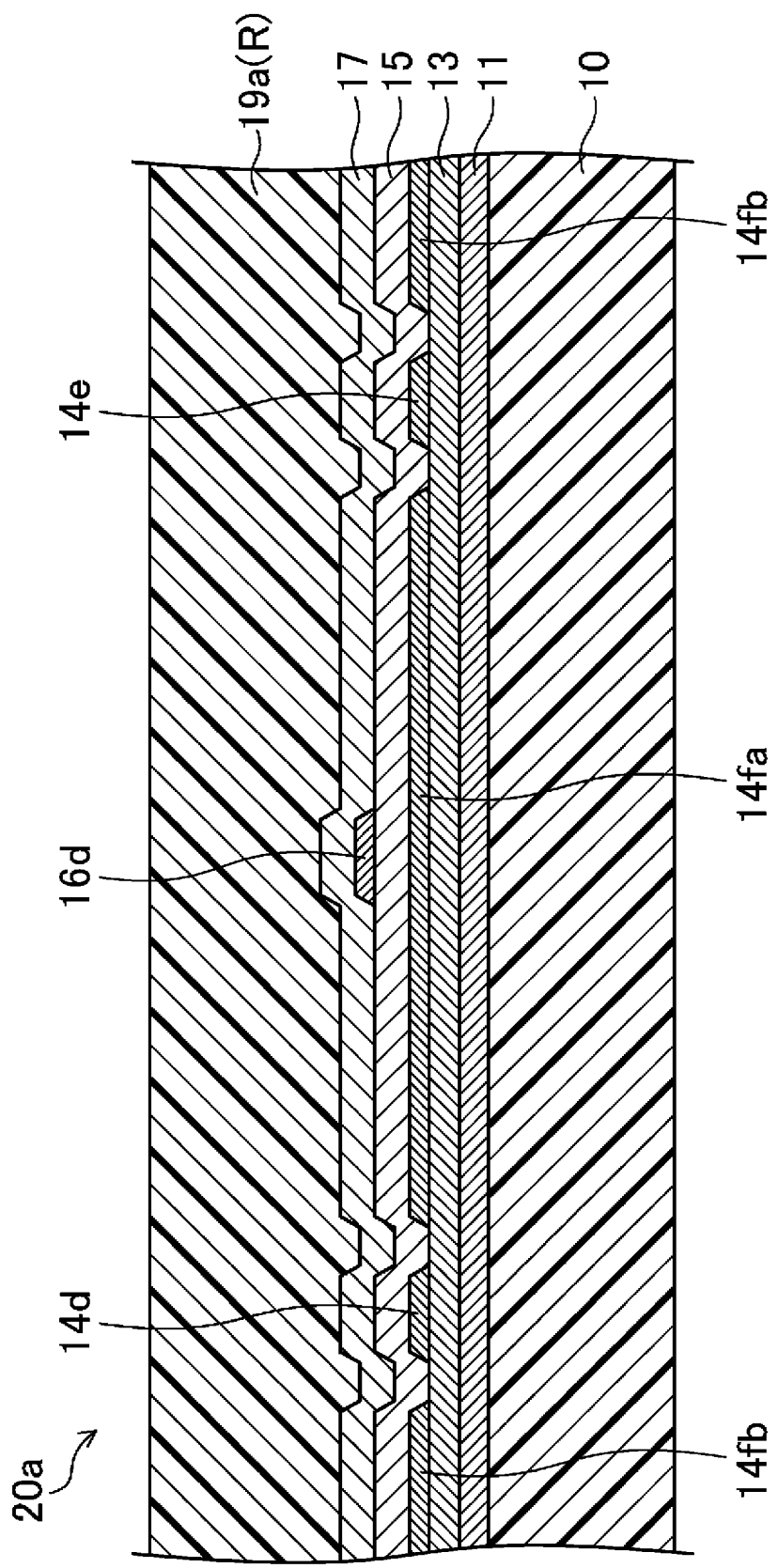
FIG. 6 is a cross-sectional view of the TFT layer taken along a line VI-VI in FIG. 4.
Figure 7:
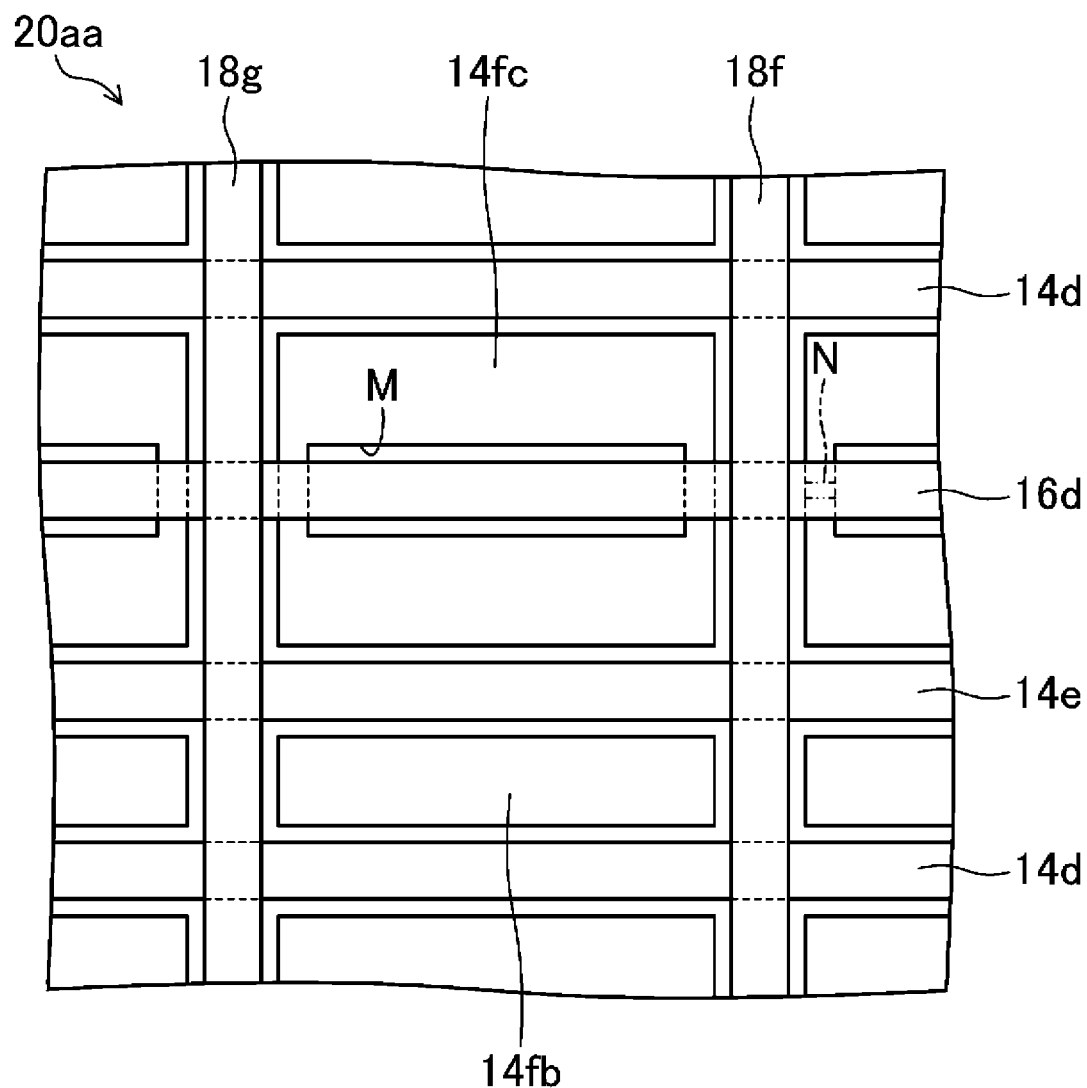
FIG. 7 is a plan view of a modified example of the TFT layer included in the organic EL display device according to the first embodiment of the disclosure.
Figure 8:
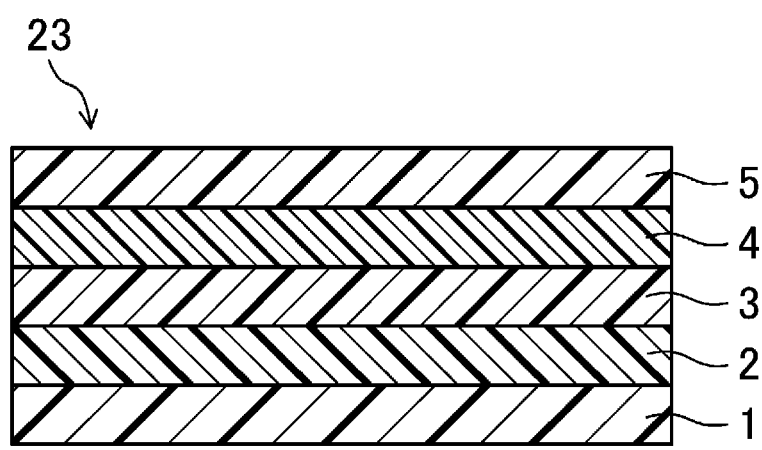
FIG. 8 is a cross-sectional view illustrating an organic EL layer included in the organic EL display device according to the first embodiment of the disclosure.
Figure 9:
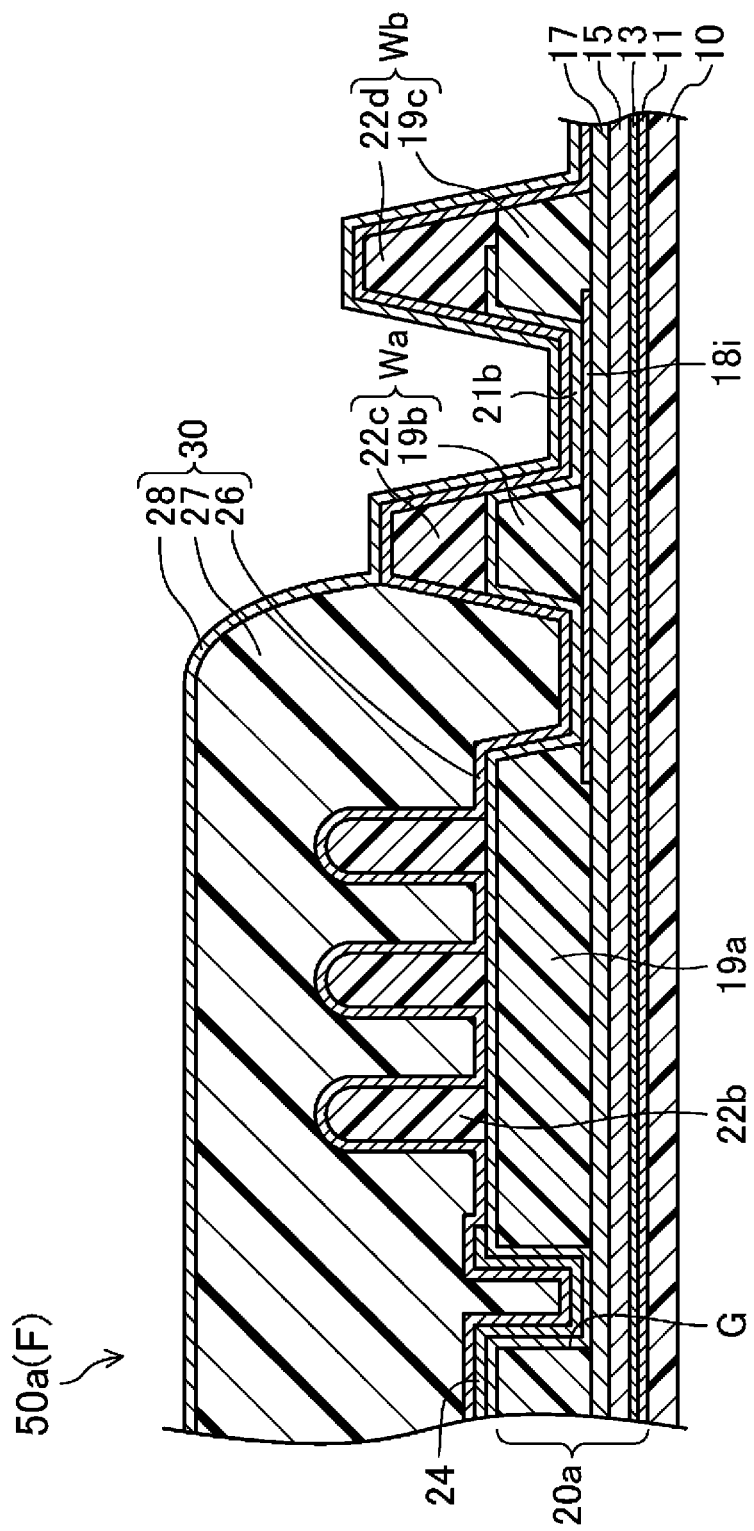
FIG. 9 is a cross-sectional view of a frame region of the organic EL display device taken along a line IX-IX in FIG. 1.

FIGS. 1 to 9 illustrate a first embodiment of a display device according to the disclosure. Note that, in each of the following embodiments, an organic EL display device including an organic EL element will be exemplified as a display device including a light-emitting element. Here, FIG. 1 is a plan view illustrating a schematic configuration of an organic EL display device 50a according to the present embodiment. FIG. 2 is a cross-sectional view of the organic EL display device 50a taken along a line II-II in FIG. 1. FIG. 3 is an equivalent circuit diagram of a TFT layer 20a included in the organic EL display device 50a. FIG. 4 is a plan view of the TFT layer 20a. FIGS. 5 and 6 are cross-sectional views of the TFT layer 20a taken along a line V-V and a line VI-VI in FIG. 4, respectively. FIG. 7 is a plan view of a TFT layer 20aa, which is a modified example of the TFT layer 20a. FIG. 8 is a cross-sectional view illustrating an organic EL layer 23 included in the organic EL display device 50a. Further, FIG. 9 is a cross-sectional view of a frame region F of the organic EL display device 50a taken along a line IX-IX in FIG. 1.

As illustrated in FIG. 1, the organic EL display device 50a includes, for example, a display region D provided in a rectangular shape and configured to display an image, and the frame region F provided in a periphery of the display region D. Note that in the present embodiment, the display region D having the rectangular shape is exemplified, but the rectangular shape includes substantial rectangular shapes such as a shape whose sides are arc-shaped, a shape whose corners are arc-shaped, and a shape in which a part of a side has a notch.

In the display region D, a plurality of subpixels P (see FIG. 4) is arranged in a matrix shape. Here, in the display region D, for example, a subpixel P including a red light-emitting region configured to display a red color, a subpixel P including a green light-emitting region configured to display a green color, and a subpixel P including a blue light-emitting region configured to display a blue color are provided adjacent to each other. Note that in the display region D, one pixel is configured by, for example, three adjacent subpixels P including the red light-emitting region, the green light-emitting region, and the blue light-emitting region, respectively.

A terminal portion T is provided at the middle right end portion of the frame region F in FIG. 1. Additionally, as illustrated in FIG. 1, in the frame region F, a bending portion B bendable, for example, by 180 degrees (in a U-shape) about a bending axis that is the vertical direction in the figure is provided between the display region D and the terminal portion T, and extends in one direction (the vertical direction in the figure). Additionally, in the frame region F, as illustrated in FIGS. 1, 2, and 9, in a flattening film 19a described later, a substantially C shaped trench G is provided in a state of extending through the flattening film 19a. Here, as illustrated in FIG. 1, the trench G is provided in a substantially C shape and the terminal portion T side opens in a plan view.

As illustrated in FIGS. 2 and 9, the organic EL display device 50a includes a resin substrate layer 10 that is provided as a base substrate, a thin film transistor (TFT) layer 20a that is provided on the resin substrate layer 10, an organic EL element 25 that is provided as the light-emitting element and included in the display region D on the TFT layer 20a, and a sealing film 30 that is provided to cover the organic EL element 25.

The resin substrate layer 10 is formed, for example, of a polyimide resin or the like.

As illustrated in FIG. 2, the TFT layer 20a includes a base coat film 11 provided on the resin substrate layer 10, a plurality of first TFTs 9a, a plurality of second TFTs 9b (see FIG. 3), a plurality of third TFTs 9c, and a plurality of capacitors 9d provided on the base coat film 11, and the flattening film 19a provided on each of the first TFTs 9a, each of the second TFTs 9b, each of the third TFTs 9c, and each of the capacitors 9d.

As illustrated in FIG. 2, in the TFT layer 20a, the base coat film 11, a semiconductor film, a gate insulating film (first inorganic insulating film) 13, a first metal film, a first interlayer insulating film (second inorganic insulating film) 15, a second metal film, a second interlayer insulating film 17, a third metal film, and the flattening film 19a are sequentially layered on the resin substrate layer 10. Here, the semiconductor film constitutes a first semiconductor layer 12a and the like to be described later, the first metal film constitutes a gate line 14d and the like to be described later, the second metal film constitutes an upper conductive layer 16 and the like to be described later, and the third metal film constitutes a source line 18f and the like to be described later.

In the TFT layer 20a, as illustrated in FIGS. 3 and 4, in the display region D, a plurality of the gate lines 14d is provided by the first metal film as first wiring lines and extending parallel to each other in the horizontal direction in the figures. In addition, in the TFT layer 20a, as illustrated in FIGS. 3 and 4, in the display region D, a plurality of light emission control lines 14e is provided by the first metal film as the first wiring lines and extending parallelparallel to each other in the horizontal direction in the figures. Note that, as illustrated in FIG. 4, each of the light emission control lines 14e is provided adjacent to each of the gate lines 14d. Further, in the TFT layer 20a, as illustrated in FIG. 4, in the display region D, a plurality of initialization power source lines 16d is provided by the second metal film as second wiring lines and extending parallelparallel to each other in the extending direction (horizontal direction in the figure) of each of the gate lines 14d. Note that in the equivalent circuit diagram of FIG. 3, the initialization power source line 16d is omitted. Further, in the TFT layer 20a, as illustrated in FIGS. 3 and 4, in the display region D, a plurality of source lines 18f is provided by the third metal film as third wiring lines and extending parallelparallel to each other in a direction orthogonal to each of the gate lines 14d (vertical direction in the figures). Further, in the TFT layer 20a, as illustrated in FIGS. 3 and 4, in the display region D, a plurality of power source lines 18g is provided by the third metal film as the third wiring lines and extending parallel-parallel to each other in the vertical direction in the figures. Note that, as illustrated in FIG. 4, each of the power source lines 18g is provided adjacent to each of the source lines 18f. Further, in the TFT layer 20a, as illustrated in FIG. 3, each subpixel P includes the first TFT 9a, the second TFT 9b, the third TFT 9c, and the capacitor 9d.

In the TFT layer 20a, as illustrated in FIGS. 4 to 6, first metal layers 14fa and 14fb that are formed by the first metal film are provided in rectangular island shapes along the source line 18f and the power source line 18g adjacent to each other and overlapping a region that is surrounded by the source line 18f and the power source line 18g adjacent to each other and the gate line 14d and the light emission control line 14e adjacent to each other. Here, as illustrated in FIG. 5, side-end portions of the source line 18f and the power source line 18g are provided to overlap inclined portions S of the first interlayer insulating film 15 that is formed to cover the end portions of the first metal layer 14fa (14fb), and of the second interlayer insulating film 17. Then, the heights of the upper faces of the source line 18f and the power source line 18g are close to the height of the upper face of the second interlayer insulating film 17 on the first metal layer 14fa (14fb) between the source line 18f and the power source line 18g. Further, as illustrated in FIGS. 4 and 6, the first metal layer 14fa is provided to overlap the initialization power source line 16d via the first interlayer insulating film 15. Note that in the present embodiment, the TFT layer 20a provided in a state that the first metal layer 14fa and the initialization power source line 16d overlap with each other is exemplified. However, as illustrated in FIG. 7, a TFT layer 20aa including the first metal layer 14fc provided with an opening M extending through, the first metal layer 14fc overlapping the initialization power source line 16d is applicable. Further, as illustrated in FIG. 7, the opening M of the first metal layer 14fc included in the TFT layer 20aa may be provided with a notch N (two-dot chain line) that cuts out the circumferential-end portion of the first metal layer 14fc. Consequently, the overlap between the first metal layer 14fc and the initialization power source line 16d is reduced. Thus, the parasitic capacitance generated in the initialization power source line 16d can be reduced.

The base coat film 11 is formed of a single-layer film or a layered film of an inorganic insulating film made of, for example, silicon nitride, silicon oxide, silicon oxynitride, or the like.

As illustrated in FIG. 3, the first TFT 9a is electrically connected to the corresponding gate line 14d, the corresponding source line 18f, and the corresponding second TFT 9b in each subpixel P. Additionally, as illustrated in FIG. 2, the first TFT 9a includes the semiconductor layer 12a, the gate insulating film 13, a gate electrode 14a, the first interlayer insulating film 15, the second interlayer insulating film 17, and a source electrode 18a and a drain electrode 18b that are sequentially provided on the base coat film 11. Here, as illustrated in FIG. 2, the semiconductor layer 12a is provided in an island shape on the base coat film 11, and includes a channel region, a source region, and a drain region, as described below. Additionally, as illustrated in FIG. 2, the gate insulating film 13 is provided to cover the semiconductor layer 12a. Additionally, as illustrated in FIG. 2, the gate electrode 14a is provided on the gate insulating film 13, and overlaps with the channel region of the semiconductor layer 12a. Additionally, as illustrated in FIG. 2, the first interlayer insulating film 15 and the second interlayer insulating film 17 are sequentially provided to cover the gate electrode 14a. Additionally, as illustrated in FIG. 2, the source electrode 18a and the drain electrode 18b are separated from each other on the second interlayer insulating film 17. Additionally, as illustrated in FIG. 2, the source electrode 18a and the drain electrode 18b are electrically connected to the source region and the drain region of the semiconductor layer 12a, respectively, via respective contact holes formed in a layered film of the gate insulating film 13, the first interlayer insulating film 15, and the second interlayer insulating film 17. Note that the gate insulating film 13, the first interlayer insulating film 15, and the second interlayer insulating film 17 are each constituted of a single-layer film or a layered film of an inorganic insulating film of, for example, silicon nitride, silicon oxide, or silicon oxynitride.

As illustrated in FIG. 3, the second TFT 9b is electrically connected to the corresponding first TFT 9a, the corresponding power source line 18g, and the corresponding third TFT 9c in each subpixel P. Note that the second TFT 9b has substantially the same structure as the first TFT 9a described above and the third TFT 9c to be described later.

As illustrated in FIG. 3, the third TFT 9c is electrically connected to the corresponding second TFT 9b, the corresponding power source line 18g, and the corresponding light emission control line 14e in each subpixel P. Additionally, as illustrated in FIG. 2, the third TFT 9c includes a semiconductor layer 12b, the gate insulating film 13, a gate electrode 14b, the first interlayer insulating film 15, the second interlayer insulating film 17, and a source electrode 18c and a drain electrode 18d that are sequentially provided on the base coat film 11. Here, as illustrated in FIG. 2, the semiconductor layer 12b is provided in an island shape on the base coat film 11, and includes a channel region, a source region, and a drain region, as with the semiconductor layer 12a. Additionally, as illustrated in FIG. 2, the gate insulating film 13 is provided to cover the semiconductor layer 12b. Additionally, as illustrated in FIG. 2, the gate electrode 14b is provided on the gate insulating film 13, and overlaps with the channel region of the semiconductor layer 12b. Additionally, as illustrated in FIG. 2, the first interlayer insulating film 15 and the second interlayer insulating film 17 are sequentially provided to cover the gate electrode 14b. Additionally, as illustrated in FIG. 2, the source electrode 18c and the drain electrode 18d are separated from each other on the second interlayer insulating film 17. Additionally, as illustrated in FIG. 2, the source electrode 18c and the drain electrode 18d are electrically connected to the source region and the drain region of the semiconductor layer 12b, respectively, via respective contact holes formed in a layered film of the gate insulating film 13, the first interlayer insulating film 15, and the second interlayer insulating film 17.

In the present embodiment, the first TFT 9a, the second TFT 9b, and the third TFT 9c of a top-gate type are exemplified as the pixel TFTs, but the first TFT 9a, the second TFT 9b, and the third TFT 9c may be a bottom-gate type.

As illustrated in FIG. 3, the capacitor 9d is electrically connected to the corresponding first TFT 9a and the corresponding power source line 18g in each subpixel P. Here, the capacitor 9d includes, as illustrated in FIG. 2, a lower conductive layer 14c that is formed in the same layer and of the same material as the gate line 14d and the like, the first interlayer insulating film 15 that is provided to cover the lower conductive layer 14c, and the upper conductive layer 16 that is provided on the first interlayer insulating film 15 and overlapping the lower conductive layer 14c. Note that the upper conductive layer 16 is electrically connected to the power source line 18g via a contact hole (not illustrated) that is formed in the second interlayer insulating film 17.

The flattening film 19a has a flat surface in the display region D, and is formed, for example, of an organic resin material such as a polyimide resin.

The organic EL element 25 includes, as illustrated in FIG. 2, a plurality of first electrodes 21a, an edge cover 22a, a plurality of organic EL layers 23, and a second electrode 24 that are provided sequentially on the flattening film 19a.

The plurality of first electrodes 21a is provided in a matrix shape on the flattening film 19a to correspond to a plurality of subpixels P, as illustrated in FIG. 2. Further, as illustrated in FIG. 2, each of the first electrodes 21a is electrically connected to the drain electrode 18d of each of the third TFTs 9c through a contact hole that is formed in the flattening film 19a. The first electrode 21a functions to inject holes (positive holes) into the organic EL layer 23. The first electrode 21a is preferably formed of a material having a large work function to improve the hole injection efficiency into the organic EL layer 23. Examples of materials constituting the first electrode 21a include metallic materials such as silver (Ag), aluminum (Al), vanadium (V), cobalt (Co), nickel (Ni), tungsten (W), gold (Au), titanium (Ti), ruthenium (Ru), manganese (Mn), indium (In), ytterbium (Yb), lithium fluoride (LiF), platinum (Pt), palladium (Pd), molybdenum (Mo), iridium (Ir), and tin (Sn). Examples of materials constituting the first electrode 21a may include an alloy with astatine (At)/astatine oxide ($AtO_2$). Examples of materials constituting the first electrode 21a may include electrically conductive oxides such as tin oxide (SnO), zinc oxide (ZnO), indium tin oxide (ITO), and indium zinc oxide (IZO). The first electrode 21a may be formed by layering a plurality of layers formed of any of the materials described above. Note that, examples of compound materials having a large work function include indium tin oxide (ITO) and indium zinc oxide (IZO).

As illustrated in FIG. 2, the edge cover 22a is provided in a lattice pattern to cover a peripheral portion of each of the first electrodes 21a. For materials making up the edge cover 22a, there are raised organic films of, for example, polyimide resin, acrylic resin, polysiloxane resin, and novolac resin. Further, as illustrated in FIG. 2, a part of the surface of the edge cover 22a is a pixel photo spacer C that protrudes upward and is provided in an island shape.

As illustrated in FIG. 2, the plurality of organic EL layers 23 is each disposed on each of the first electrodes 21a and is provided in a matrix shape to correspond to the plurality of subpixels. Here, as illustrated in FIG. 8, each of the organic EL layers 23 includes a hole injection layer 1, a hole transport layer 2, a light-emitting layer 3, an electron transport layer 4, and an electron injection layer 5, which are provided sequentially in that order on the first electrode 21a.

The hole injection layer 1 is also referred to as an anode buffer layer, and functions to reduce an energy level difference between the first electrode 21a and the organic EL layer 23 to thereby improve the hole injection efficiency from the first electrode 21a into the organic EL layer 23. Here, examples of materials constituting the hole injection layer 1 include triazole derivatives, oxadiazole derivatives, imidazole derivatives, polyarylalkane derivatives, pyrazoline derivatives, phenylenediamine derivatives, oxazole derivatives, styrylanthracene derivatives, fluorenone derivatives, hydrazone derivatives, and stilbene derivatives.

The hole transport layer 2 functions to improve the hole transport efficiency from the first electrode 21a to the organic EL layer 23. Here, examples of materials constituting the hole transport layer 2 include porphyrin derivatives, aromatic tertiary amine compounds, styrylamine derivatives, polyvinylcarbazole, poly-p-phenylenevinylene, polysilane, triazole derivatives, oxadiazole derivatives, imidazole derivatives, polyarylalkane derivatives, pyrazoline derivatives, pyrazolone derivatives, phenylenediamine derivatives, arylamine derivatives, amine-substituted chalcone derivatives, oxazole derivatives, styrylanthracene derivatives, fluorenone derivatives, hydrazone derivatives, stilbene derivatives, hydrogenated amorphous silicon, hydrogenated amorphous silicon carbide, zinc sulfide, and zinc selenide.

The light-emitting layer 3 is a region where positive holes and electrons are injected from the first electrode 21a and the second electrode 24, respectively, and the holes and the electrons recombine, when a voltage is applied via the first electrode 21a and the second electrode 24. Here, the light-emitting layer 3 is formed of a material having great luminous efficiency. Moreover, examples of materials constituting the light-emitting layer 3 include metal oxinoid compounds (8-hydroxyquinoline metal complexes), naphthalene derivatives, anthracene derivatives, diphenyl ethylene derivatives, vinyl acetone derivatives, triphenylamine derivatives, butadiene derivatives, coumarin derivatives, benzoxazole derivatives, oxadiazole derivatives, oxazole derivatives, benzimidazole derivatives, thiadiazole derivatives, benzothiazole derivatives, styryl derivatives, styrylamine derivatives, bisstyrylbenzene derivatives, trisstyrylbenzene derivatives, perylene derivatives, perinone derivatives, aminopyrene derivatives, pyridine derivatives, rhodamine derivatives, aquidine derivatives, phenoxazone, quinacridone derivatives, rubrene, poly-p-phenylenevinylene, and polysilane.

The electron transport layer 4 functions to facilitate migration of electrons to the light-emitting layer 3 efficiently. Here, examples of materials constituting the electron transport layer 4 include oxadiazole derivatives, triazole derivatives, benzoquinone derivatives, naphthoquinone derivatives, anthraquinone derivatives, tetracyanoanthraquinodimethane derivatives, diphenoquinone derivatives, fluorenone derivatives, silole derivatives, and metal oxinoid compounds, as organic compounds.

The electron injection layer 5 functions to reduce an energy level difference between the second electrode 24 and the organic EL layer 23 to thereby improve the efficiency of electron injection into the organic EL layer 23 from the second electrode 24, and the electron injection layer 5 can lower the drive voltage of the organic EL element 25 by this function. Note that the electron injection layer 5 is also referred to as a cathode buffer layer. Here, examples of materials constituting the electron injection layer 5 include inorganic alkaline compounds, such as lithium fluoride (LiF), magnesium fluoride ($MgF_2$), calcium fluoride ($CaF_2$), strontium fluoride ($SrF_2$), and barium fluoride ($BaF_2$), aluminum oxide ($Al_2O_3$), and strontium oxide (SrO).

As illustrated in FIG. 2, the second electrode 24 is disposed to cover the organic EL layer 23 and the edge cover 22a. In addition, the second electrode 24 functions to inject electrons into the organic EL layer 23. In addition, the second electrode 24 is preferably formed of a material with a low work function to improve the efficiency of electron injection into the organic EL layer 23. Here, examples of materials that may be included in the second electrode 24 include silver (Ag), aluminum (Al), vanadium (V), cobalt (Co), nickel (Ni), tungsten (W), gold (Au), calcium (Ca), titanium (Ti), yttrium (Y), sodium (Na), ruthenium (Ru), manganese (Mn), indium (In), magnesium (Mg), lithium (Li), ytterbium (Yb), and lithium fluoride (LiF). The second electrode 24 may be formed of alloys of magnesium (Mg)/ copper (Cu), magnesium (Mg)/silver (Ag), sodium (Na)/ potassium (K), astatine (At)/astatine oxide (AtO$_2$), lithium (Li)/aluminum (Al), lithium (Li)/calcium (Ca)/aluminum (Al), and lithium fluoride (LiF)/calcium (Ca)/aluminum (Al), for example.

In addition, the second electrode 24 may be formed of electrically conductive oxide, for example, tin oxide (SnO), zinc oxide (ZnO), indium tin oxide (ITO), indium zinc oxide (IZO), or the like. In addition, the second electrode 24 may be formed by layering a plurality of layers formed of any of the materials described above. Note that, examples of materials having a small work function include magnesium (Mg), lithium (Li), lithium fluoride (LiF), magnesium (Mg)/copper (Cu), magnesium (Mg)/silver (Ag), sodium (Na)/potassium (K), lithium (Li)/aluminum (Al), lithium (Li)/calcium (Ca)/ aluminum (Al), and lithium fluoride (LiF)/calcium (Ca)/ aluminum (Al).

As illustrated in FIG. 2, the sealing film 30 includes a first inorganic film 26 provided so as to cover the second electrode 24, an organic film 27 provided on the first inorganic film 26, and a second inorganic film 28 provided so as to cover the organic film 27, and functions to protect the organic EL layer 23 from moisture, oxygen, and the like. Here, the first inorganic film 26 and the second inorganic film 28 are formed of an inorganic material such as silicon oxide (SiO$_2$), aluminum oxide (Al$_2$O$_3$), silicon nitride (SiNx (x is a positive number)) such as trisilicon tetranitride (Si$_3$N$_4$), or silicon carbonitride (SiCN). Further, the organic film 27 is formed of, for example, an organic material such as acrylic resin, polyurea resin, parylene resin, polyimide resin, and polyamide resin.

Further, in the frame region F, the organic EL display device 50a includes a first frame wiring line 18h (see FIG. 20) provided in a frame shape inside the trench G. Here, the first frame wiring line 18h is electrically connected to a terminal to which a high power supply voltage (ELVDD) is input at the terminal portion T. Further, the first frame wiring line 18h is electrically connected to the plurality of power source lines 18g that is arranged in the display region D on the display region D side. The first frame wiring line 18h is formed of the same material as the source line 18f in the same layer.

Additionally, as illustrated in FIG. 9, the organic EL display device 50a includes, in the frame region F, a second frame wiring line 18i (see FIG. 20) provided in a substantially C shape on the outside of the trench G. Here, the second frame wiring line 18i is electrically connected to a terminal to which a low power supply voltage (ELVSS) is input at the terminal portion T. Further, as illustrated in FIG. 9, the second frame wiring line 18i is electrically connected to the second electrode 24 via the second conductive layer 21b. The second frame wiring line 18i is formed of the same material as the source line 18f in the same layer. The second conductive layer 21b is formed of the same material as the first electrode 21a in the same layer.

Additionally, as illustrated in FIGS. 1 and 9, the organic EL display device 50a includes, in the frame region F, a first dam wall Wa that is provided in a frame shape so as to surround the display region D and overlaps with the circumferential-end portion of an organic film 27 of the sealing film 30, and a second dam wall Wb provided in a frame shape so as to surround the first dam wall Wa.

As illustrated in FIG. 9, the first dam wall Wa includes a lower layer resin layer 19b formed of the same material as the flattening film 19a in the same layer, and an upper layer resin layer 22c that is provided on the lower layer resin layer 19b via the conductive layer 21b, and is formed of the same material as the edge cover 22a in the same layer.

As illustrated in FIG. 9, the second dam wall Wb includes a lower layer resin layer 19c formed of the same material as the flattening film 19a in the same layer, and an upper layer resin layer 22d that is provided on the lower layer resin layer 19c via the conductive layer 21b, and is formed of the same material as the edge cover 22a in the same layer.

Further, as illustrated in FIGS. 2 and 9, the organic EL display device 50a includes a plurality of peripheral photo spacers 22b provided in island shapes, on the flattening film 19a, and in the frame region F so as to protrude upward in the figures. Here, the peripheral photo spacer 22b is formed of the same material as the edge cover 22a in the same layer.

In each subpixel P of the organic EL display device 50a described above, in a case where the first TFT 9a is turned on, a data signal is written into the gate electrode of the second TFT 9b and the capacitor 9d through the source line 18f in response to the gate signal being input to the first TFT 9a through the gate line 14d, the third TFT 9c is then turned on, a current corresponding to the gate voltage of the second TFT 9b is supplied from the power source line 18g to the organic EL layer 23 in response to the light emission control signal being input to the third TFT 9c through the light emission control line 14e, and the light-emitting layer 3 of the organic EL layer 23 emits light to display an image. Note that, in the organic EL display device 50a, even when the first TFT 9a is to be in an off state, the gate voltage of the second TFT 9b is held by the capacitor 9d, and thus light emission by the light-emitting layer 3 is maintained in each subpixel P until a gate signal of the next frame is input.

Next, a manufacturing method for the organic EL display device 50a according to the present embodiment will be described. Note that the manufacturing method for the organic EL display device 50a according to the present embodiment includes a TFT layer forming process, an organic EL element forming process, and a sealing film forming process.

TFT Layer Forming Process

For example, using a known method, the TFT layer 20a is formed by forming the base coat film 11, the first TFT 9a, the second TFT 9b, the third TFT 9c, the capacitor 9d, and the flattening film 19a on a surface of the resin substrate layer 10, which is formed on a glass substrate.

Here, in the TFT layer forming process, the first metal layers 14fa and 14fb are formed between the gate line 14d and light emission control lines 14e that are adjacent to each other and simultaneously formed when the gate electrode 14a and the like of the first TFT 9a are formed.

Further, in the TFT layer forming process, after forming the source line 18f and the power source line 18g at the same time as the source electrode 18a, the drain electrode 18b and the like of the first TFT 9a, a belt-shaped resist pattern is formed so as to cover each source line 18f and each power source line 18g, and a rework process is performed for removing the film residue of the conductive film between the source line 18f and the power source line 18g by etching through the resist pattern. In the rework process, a resist film R (see FIGS. 5 and 6) is formed on the entire substrate so as to cover each source line 18f and each power source line 18g, and then the resist film R is exposed, developed, and post-baked to form a resist pattern. Here, by arranging the first metal layers 14fa and 14fb between the source line 18f and the power source line 18g that are adjacent to each other, the heights of the upper faces of the source line 18f and the power source line 18g become close to the height of the upper face of the second interlayer insulating film 17 between the source line 18f and the power source line 18g. Therefore, the thicknesses of the resist film R on the source line 18f and the power source line 18g are close to the thickness of the resist film R on the second interlayer insulating film 17 between the source line 18f and the power source line 18g. As a result, the shortage of exposure amount to the resist film R that is on the second interlayer insulating film 17 between the source line 18f and the power source line 18g is solved. Thus, the film residue of the resist film R is less likely to remain between the source line 18f and the power source line 18g.

Organic EL Element Forming Process

The organic EL element 25 is formed by forming the first electrode 21a, the edge cover 22a, the organic EL layers 23 (the hole injection layer 1, the hole transport layer 2, the light-emitting layer 3, the electron transport layer 4, and the electron injection layer 5), and the second electrode 24 on the flattening film 19a of the TFT layer 20a that has been formed in the TFT layer forming process, by using a known method.

Sealing Film Forming Process

First, in a substrate surface in which the organic EL element 25 is formed at the organic EL element forming process as described above is formed, the first inorganic film 26 is formed by, for example, forming an inorganic insulating film such as a silicon nitride film, a silicon oxide film, or a silicon oxynitride film, by a plasma chemical vapor deposition (CVD) method with a mask.

Next, on the substrate surface formed with the first inorganic film 26, a film made of an organic resin material such as acrylic resin is formed by, for example, using an ink-jet method to form the organic film 27.

Further, an inorganic insulating film such as a silicon nitride film, a silicon oxide film, or a silicon oxynitride film is formed by a plasma CVD method on the substrate formed with the organic film 27 with a mask to form the second inorganic film 28, thereby forming the sealing film 30.

Finally, after a protective sheet (not illustrated) is bonded on the substrate surface on which the sealing film 30 is formed, by irradiating the laser light from the glass substrate side of the resin substrate layer 10, the glass substrate is peeled off from a lower surface of the resin substrate layer 10, and then, a protective sheet (not illustrated) is bonded on the lower surface of the resin substrate layer 10 from which the glass substrate has been peeled.

The organic EL display device 50a of the present embodiment can be manufactured in this manner.

As described above, according to the organic EL display device 50a of the present embodiment, the first metal layers 14fa and 14fb that are formed by the first metal film are provided in the island shapes along the source line 18f and the power source line 18g that are adjacent to each other and overlap the region surrounded by the source line 18f and the power source line 18g that are adjacent to each other and the gate line 14d and the light emission control line 14e that are adjacent to each other. Consequently, the heights of the upper faces of the source line 18f and the power source line 18g become close to the height of the upper face of the second interlayer insulating film 17 between the source line 18f and the power source line 18g. Therefore, the thicknesses of the resist film R on the source line 18f and the power source line 18g can be close to the thickness of the resist film R on the second interlayer insulating film 17 between the source line 18f and the power source line 18g. As a result, the shortage of exposure amount to the resist film R that is on the second interlayer insulating film 17 between the source line 18f and the power source line 18g is solved. Thus, the film residue of the resist film R between the source line 18f and the power source line 18g can be suppressed.

Second Embodiment

Figure 10:
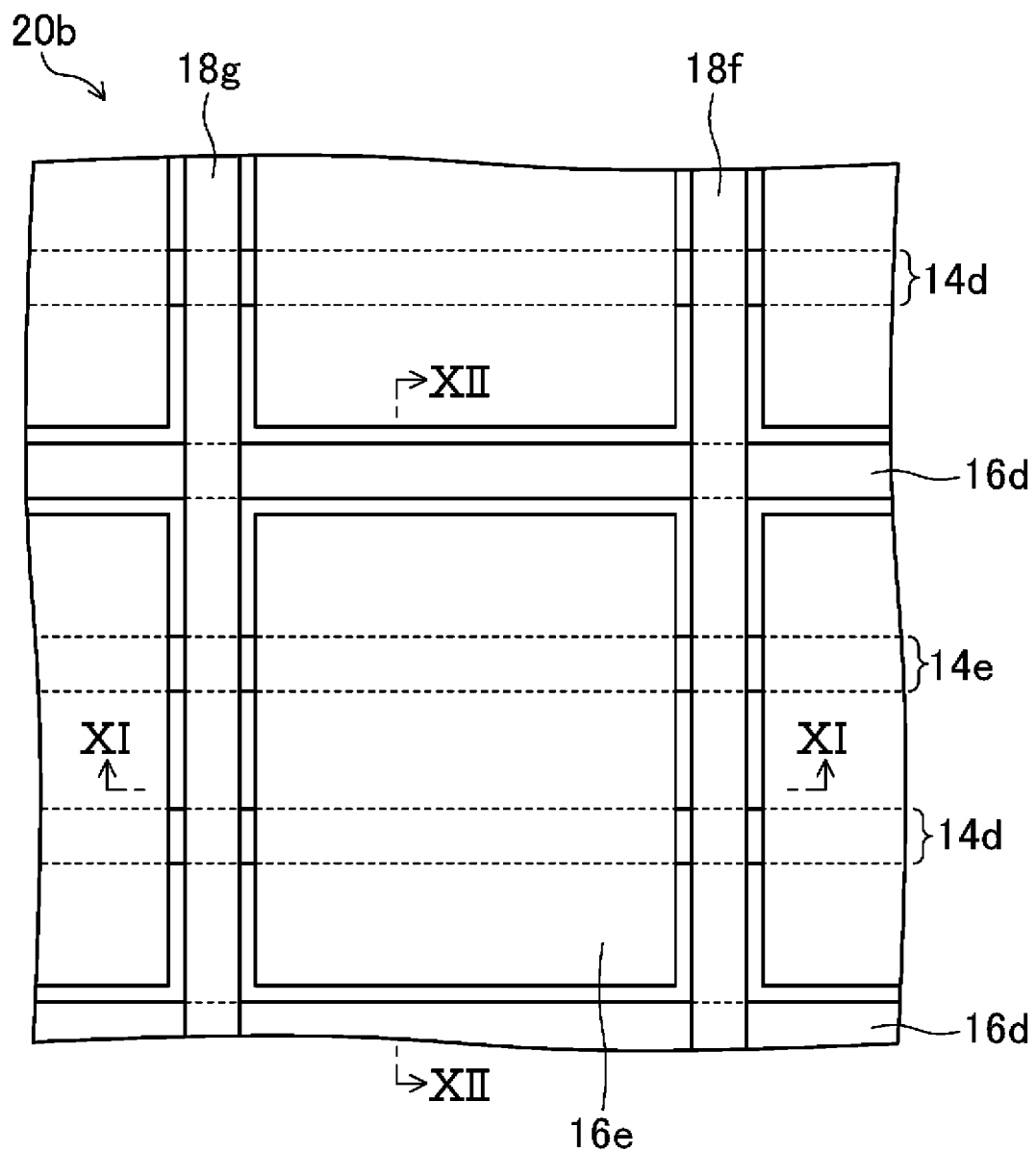
FIG. 10 is a plan view of a TFT layer included in an organic EL display device according to a second embodiment of the disclosure.
Figure 11:
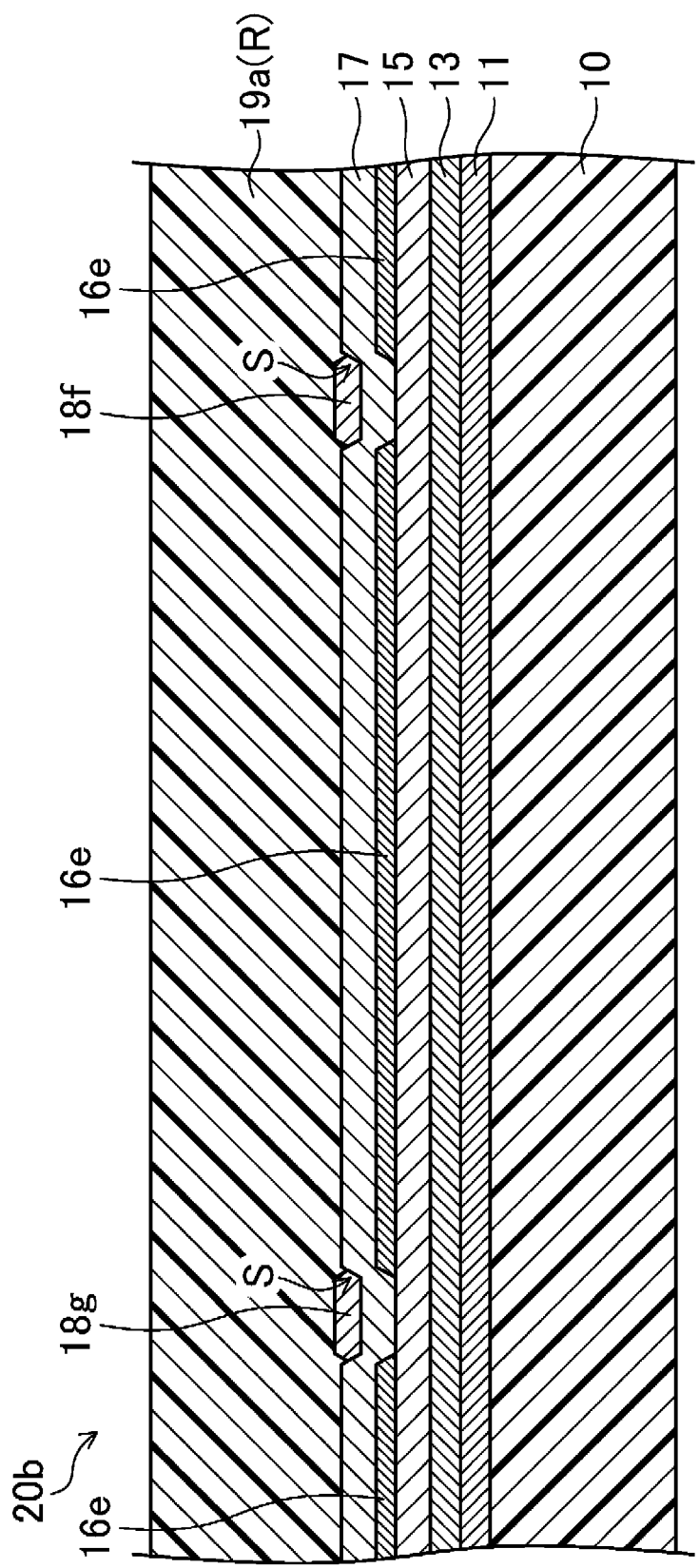
FIG. 11 is a cross-sectional view of the TFT layer taken along a line XI-XI in FIG. 10.
Figure 12:
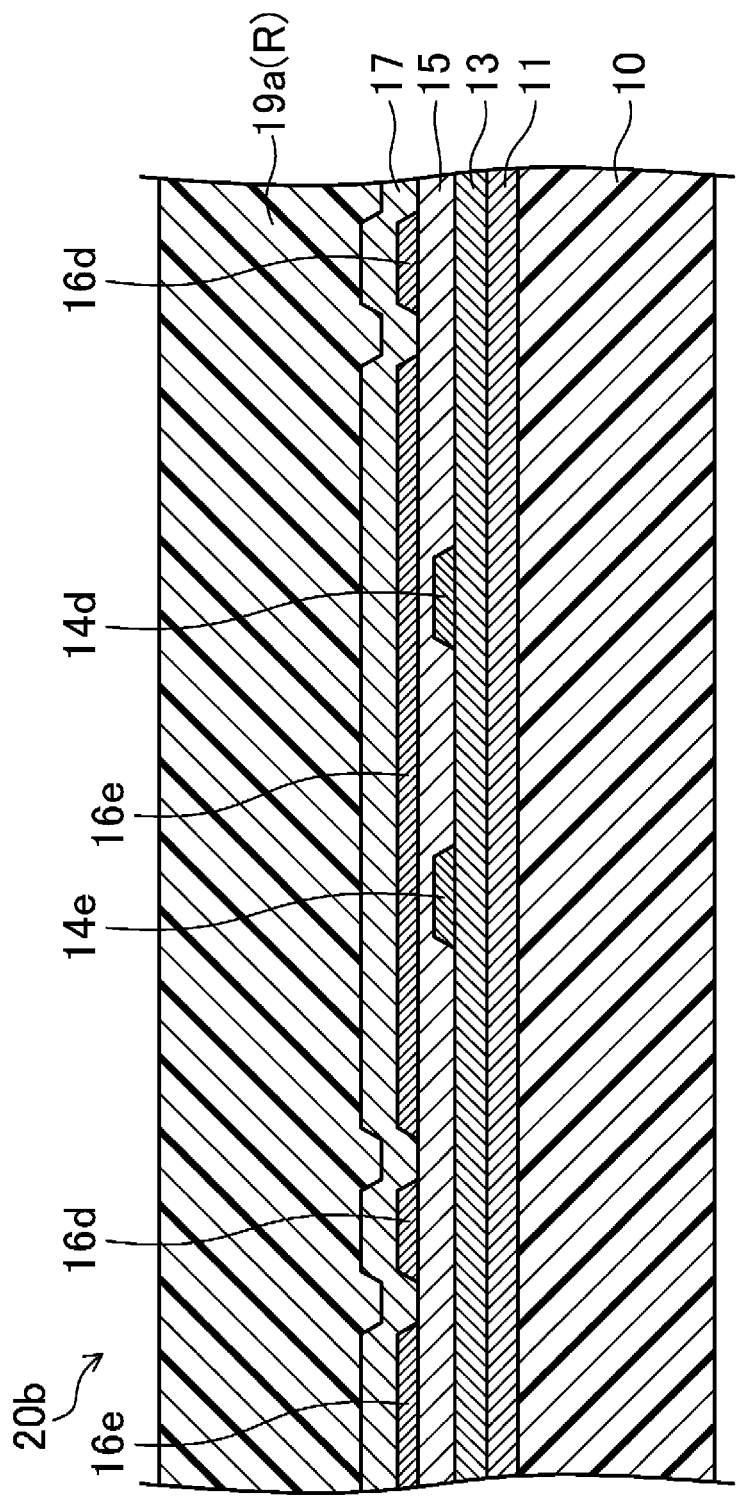
FIG. 12 is a cross-sectional view of the TFT layer taken along a line XII-XII in FIG. 10.
Figure 13:
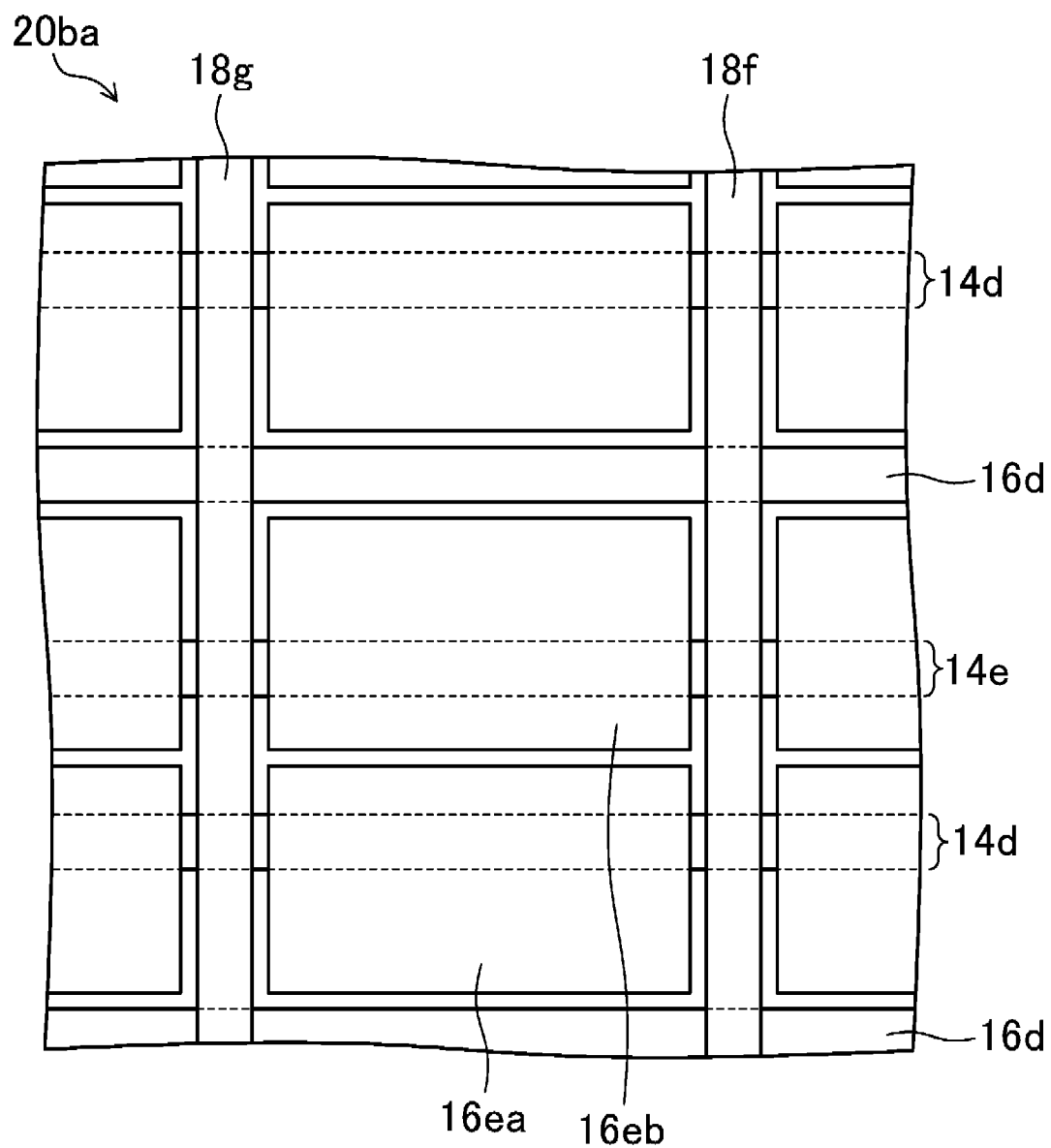
FIG. 13 is a plan view of the modified example of the TFT layer included in an organic EL display device according to the second embodiment of the disclosure.

FIGS. 10 to 13 illustrate a second embodiment of the display device according to the disclosure. Here, FIG. 10 is a plan view of a TFT layer 20b included in an organic EL display device of the present embodiment. FIGS. 11 and 12 are cross-sectional views of the TFT layer 20b taken along a line XI-XI and a line XII-XII in FIG. 10, respectively. FIG. 13 is a plan view of a TFT layer 20ba, which is a modified example of the TFT layer 20b. In the following embodiment, like reference signs will be given to like portions to those illustrated in FIGS. 1 to 9, so that a detailed description thereof will be omitted.

In the first embodiment described above, the organic EL display device 50a, including the TFT layer 20a that is provided with the first metal layers 14fa and 14fb along the source line 18f and the power source line 18g that are adjacent to each other is illustrated. In the present embodiment, the organic EL display device, including the TFT layer 20b that is provided with a second metal layer 16e along the source line 18f and power source line 18g that are adjacent to each other, will be exemplified.

The organic EL display device of the present embodiment, like the organic EL display device 50a of the first embodiment described above, includes the display region D and the frame region F that is provided on the periphery of the display region D.

As with the organic EL display device 50a of the first embodiment described above, the organic EL display device of the present embodiment includes the resin substrate layer 10, the TFT layer 20b that is provided on the resin substrate layer 10, the organic EL element 25 that is provided on the TFT layer 20b, and the sealing film 30 that is provided to cover the organic EL element 25.

Similar to the TFT layer 20a according to the first embodiment described above, the TFT layer 20b includes the base coat film 11 that is provided on the resin substrate layer 10, the plurality of first TFTs 9a, the plurality of second TFTs 9b, the plurality of third TFTs 9c, and the plurality of capacitors 9d that is provided on the base coat film 11, and the flattening film 19a is provided on each of the first TFTs 9a, each of the second TFTs 9b, each of the third TFTs 9c, and each of the capacitors 9d.

In the TFT layer 20b, similar to the TFT layer 20a according to the first embodiment described above, the base coat film 11, the semiconductor film, the gate insulating film (first inorganic insulating film) 13, the first metal film, the first interlayer insulating film (second inorganic insulating film) 15, the second metal film, the second interlayer insulating film 17, the third metal film, and the flattening film 19a are sequentially layered on the resin substrate layer 10.

In the TFT layer 20b, as illustrated in FIG. 10, in the display region D, the plurality of gate lines 14d is provided by the first metal film as the first wiring lines and extending parallelparallel to each other in the horizontal direction in the figure. In addition, in the TFT layer 20b, as illustrated in FIG. 10, in the display region D, the plurality of light emission control lines 14e is provided by the first metal film as the first wiring lines and extending parallel to each other in the horizontal direction in the figure. Note that, as illustrated in FIG. 10, each of the light emission control lines 14e is provided adjacent to each of the gate lines 14d. Further, in the TFT layer 20b, as illustrated in FIG. 10, in the display region D, the plurality of initialization power source lines 16d is provided by the second metal film as the second wiring lines and extending parallel to each other in the extending direction (horizontal direction in the figure) of each of the gate lines 14d. Further, in the TFT layer 20b, as illustrated in FIG. 10, in the display region D, the plurality of source lines 18f is provided by the third metal film as the third wiring lines and the plurality of source lines 18f is extending parallel to each other and in a direction orthogonal to each of gate lines 14d (vertical direction in the figure). Further, in the TFT layer 20b, as illustrated in FIG. 10, in the display region D, the plurality of power source lines 18g is provided by the third metal film as the third wiring lines and the plurality of power source lines 18g is extending parallel to each other and in the vertical direction in the figure. Note that, as illustrated in FIG. 10, each of the power source lines 18g is provided adjacent to each of the source lines 18f. In addition, in the TFT layer 20b, similar to the TFT layer 20a according to the first embodiment described above, each subpixel P includes the first TFT 9a, the second TFT 9b, the third TFT 9c, and the capacitor 9d.

In the TFT layer 20b, as illustrated in FIGS. 10 to 12, the second metal layer 16e that is formed by the second metal film is provided in a rectangular island shape along the source line 18f and the power source line 18g that are adjacent to each other and overlaps a region surrounded by the source line 18f and the power source line 18g that are adjacent to each other and a pair of initialization power source lines 16d that are adjacent to each other. Here, as illustrated in FIG. 11, side-end portions of the source line 18f and the power source line 18g overlap the inclined portions S of the second interlayer insulating film 17 that is formed covering the end portions of the second metal layer 16e. Then, the heights of the upper faces of the source line 18f and the power source line 18g are close to the height of the upper face of the second interlayer insulating film 17 that is on the second metal layer 16e between the source line 18f and the power source line 18g. Additionally, as illustrated in FIGS. 10 and 12, the second metal layer 16e overlaps the gate line 14d and the light emission control line 14e via the first interlayer insulating film 15. Note that in the present embodiment, the TFT layer 20b, in which one island-shaped second metal layer 16e is provided in the region surrounded by the source line 18f and the power source line 18g that are adjacent to each other and the pair of initialization power source lines 16d that are adjacent to each other, is exemplified. However, as illustrated in FIG. 13, a TFT layer 20ba, configured by dividing one island-shaped second metal layer 16e into a plurality of (for example, two) portions, which are an island-shaped second metal layer 16ea overlapping the gate line 14d and an island-shaped second metal layer 16eb overlapping the light emission control line 14e, is also applicable.

As with the organic EL display device 50a of the first embodiment described above, the organic EL display device provided with the TFT layer 20b of the present embodiment has flexibility and is configured to display an image by causing the light-emitting layer 3 of the organic EL layer 23 to emit light as appropriate via the first TFT 9a, the second TFT 9b, and the third TFT 9c in each subpixel P.

The organic EL display device provided with the TFT layer 20b of the present embodiment can be manufactured, in the TFT layer forming process of the method for manufacturing the organic EL display device 50a as described in the first embodiment, instead of forming the first metal layers 14fa and 14fb, by forming the second metal layer 16e between the pair of initialization power source lines 16d adjacent to each other that are simultaneously formed when the upper conductive layer 16 of the capacitor 9d is formed.

As described above, according to the organic EL display device provided with the TFT layer 20b of the present embodiment, the second metal layer 16e that is formed by the second metal film is provided in the island shape along the source line 18f and the power source line 18g that are adjacent to each other and overlaps the region surrounded by the source line 18f and the power source line 18g that are adjacent to each other and the pair of initialization power source lines 16d that are adjacent to each other. Consequently, the heights of the upper faces of the source line 18f and the power source line 18g become close to the height of the upper face of the second interlayer insulating film 17 that is between the source line 18f and the power source line 18g. Therefore, the thicknesses of the resist film R on the source line 18f and the power source line 18g can be close to the thickness of the resist film R on the second interlayer insulating film 17 between the source line 18f and the power source line 18g. As a result, the shortage of exposure amount to the resist film R that is on the second interlayer insulating film 17 between the source line 18f and the power source line 18g is solved. Thus, the film residue of the resist film R between the source line 18f and the power source line 18g can be suppressed.

Third Embodiment

Figure 14:
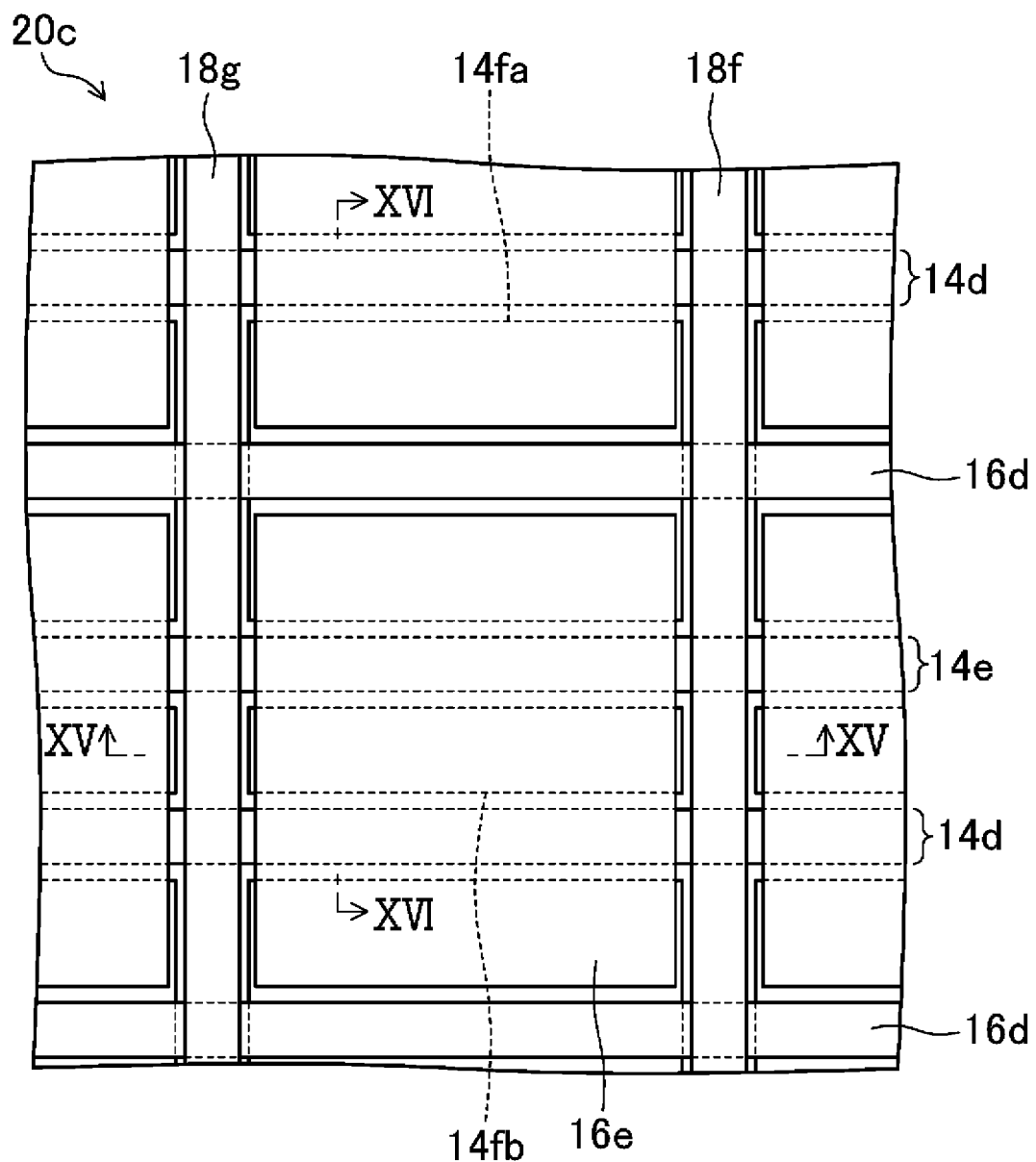
FIG. 14 is a plan view of the TFT layer included in an organic EL display device according to a third embodiment of the disclosure.
Figure 15:
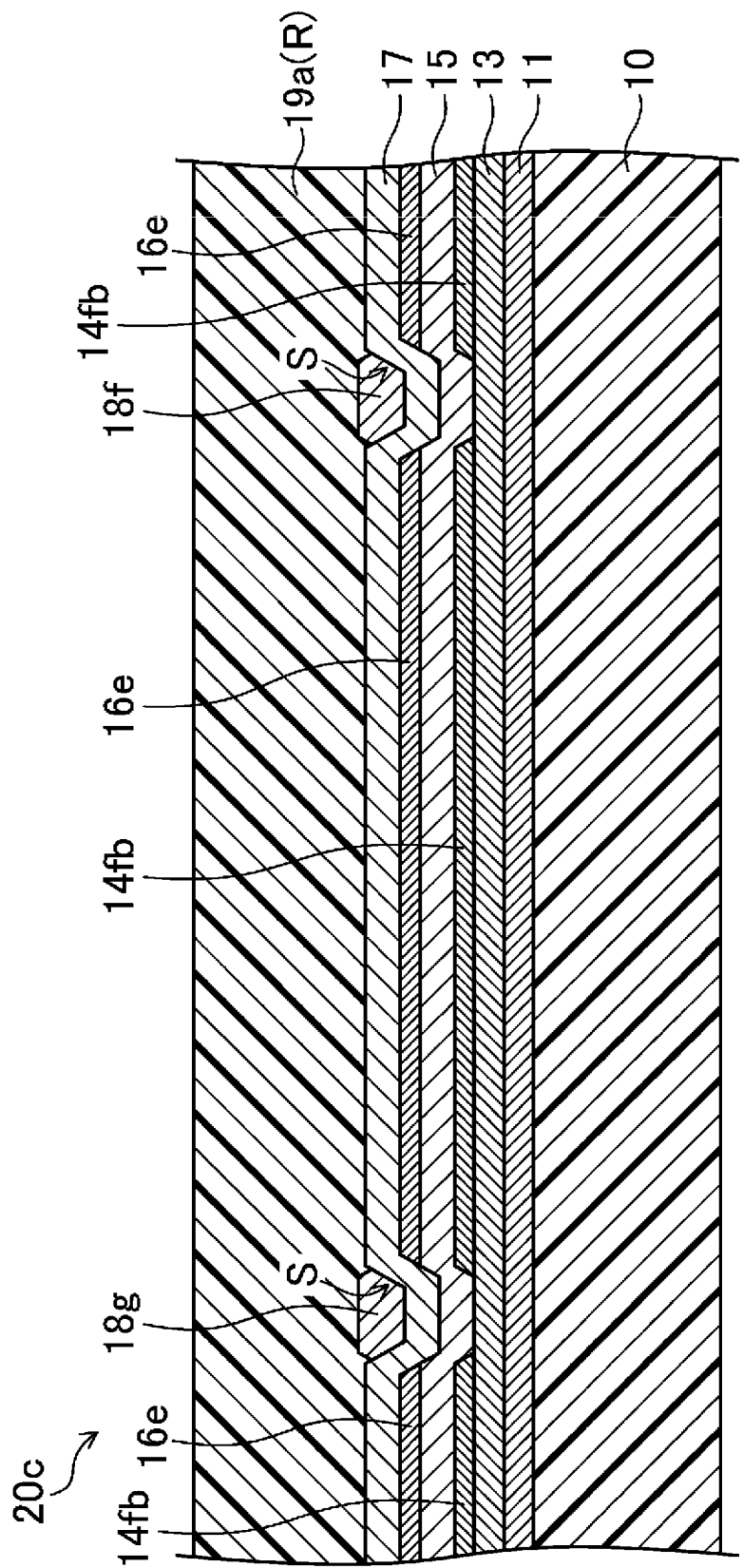
FIG. 15 is a cross-sectional view of the TFT layer taken along a line XV-XV in FIG. 14.
Figure 16:
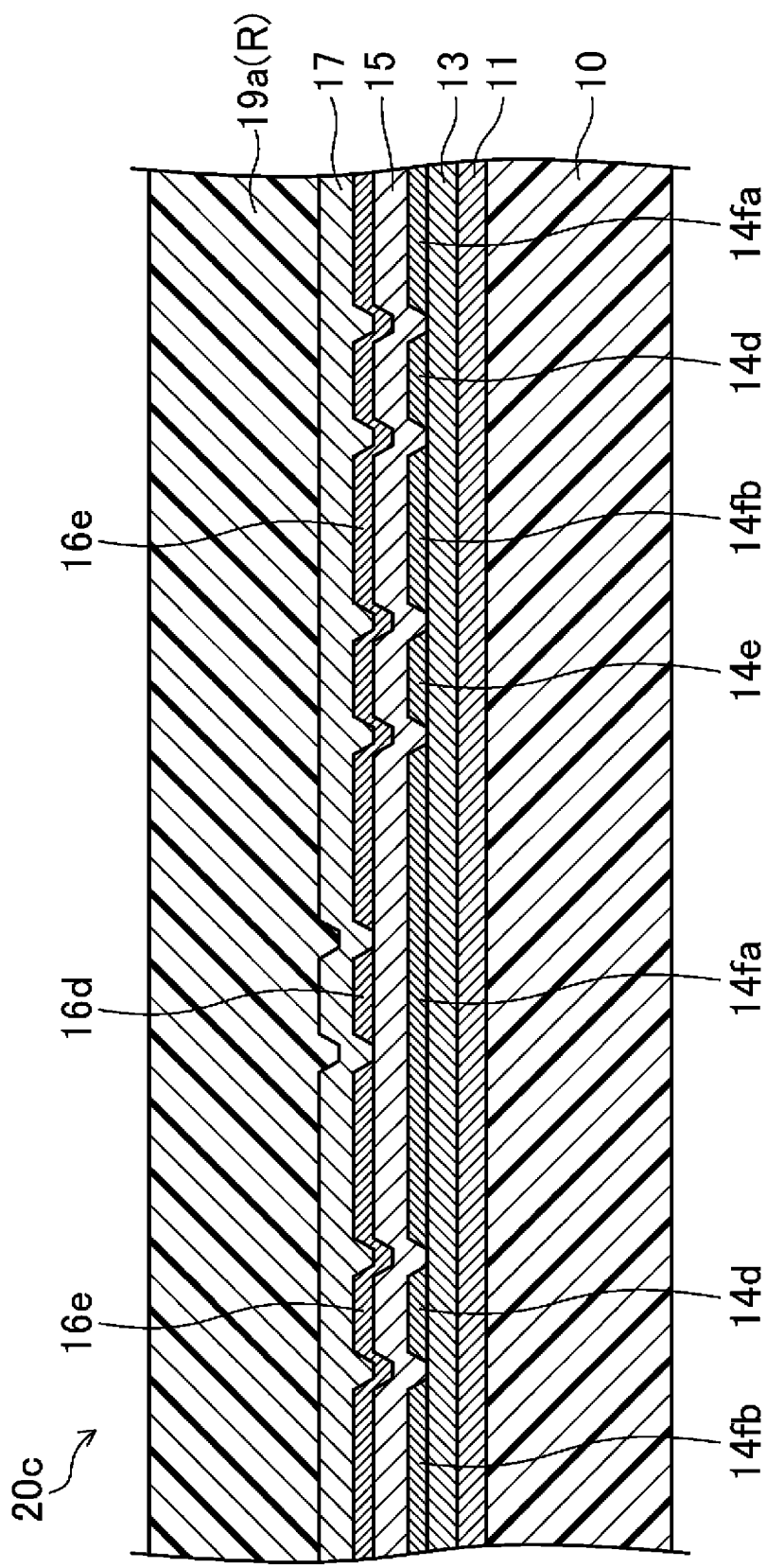
FIG. 16 is a cross-sectional view of the TFT layer taken along a line XVI-XVI in FIG. 14.
Figure 17:
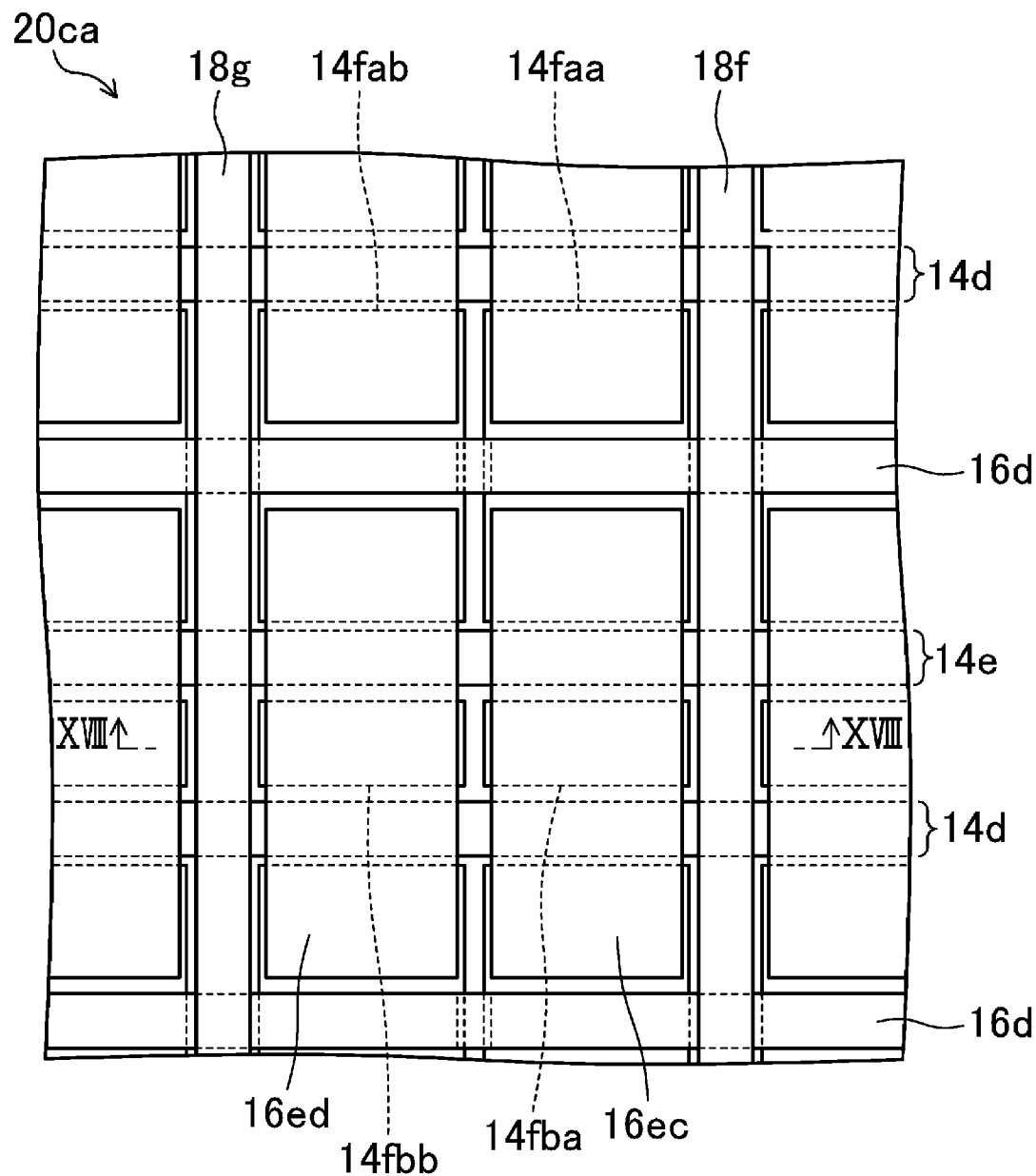
FIG. 17 is a plan view of the first modified example of the TFT layer included in the organic EL display device according to the third embodiment of the disclosure.
Figure 18:
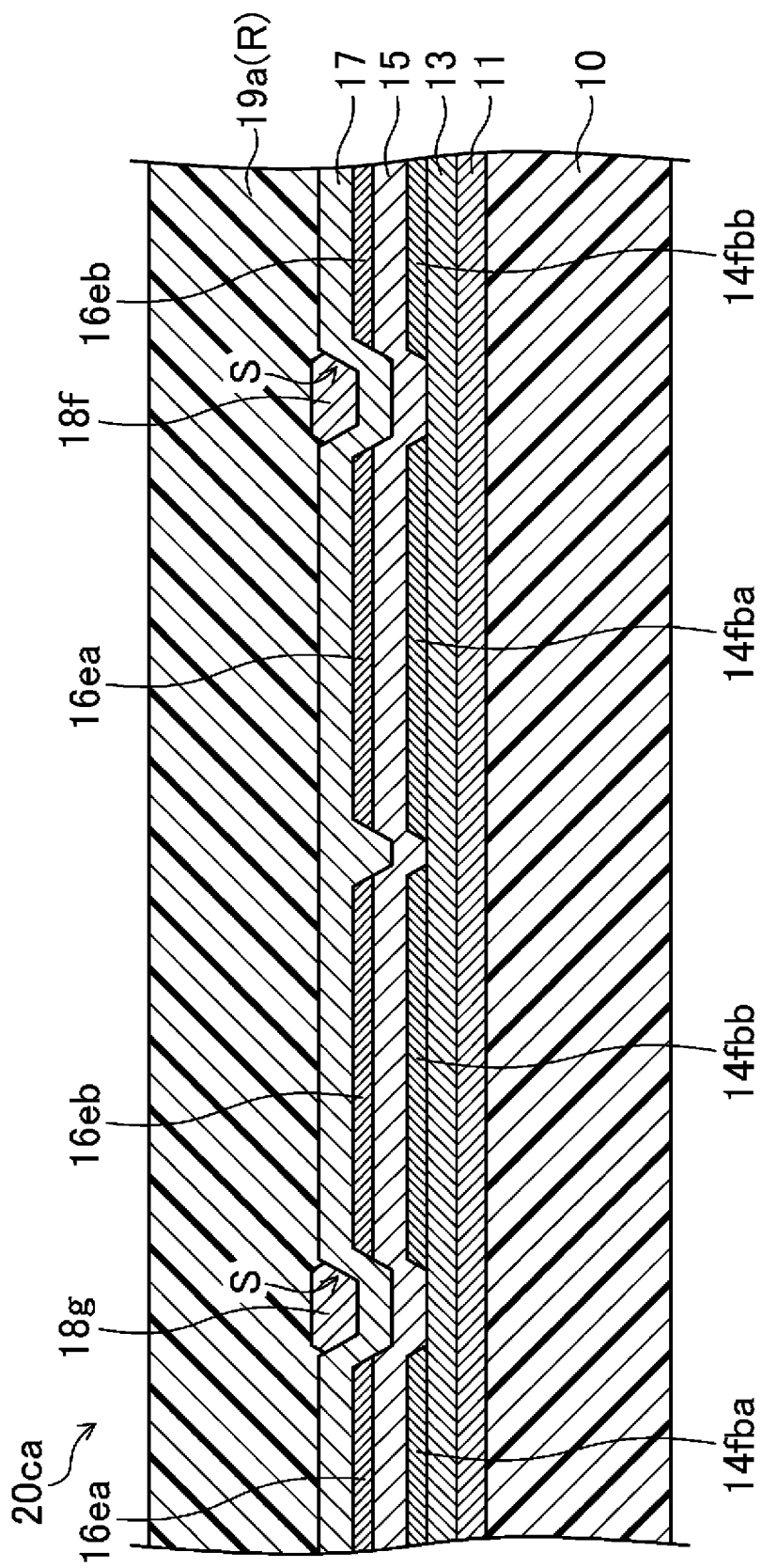
FIG. 18 is a cross-sectional view of the TFT layer taken along a line XVIII-XVIII in FIG. 17.
Figure 19:
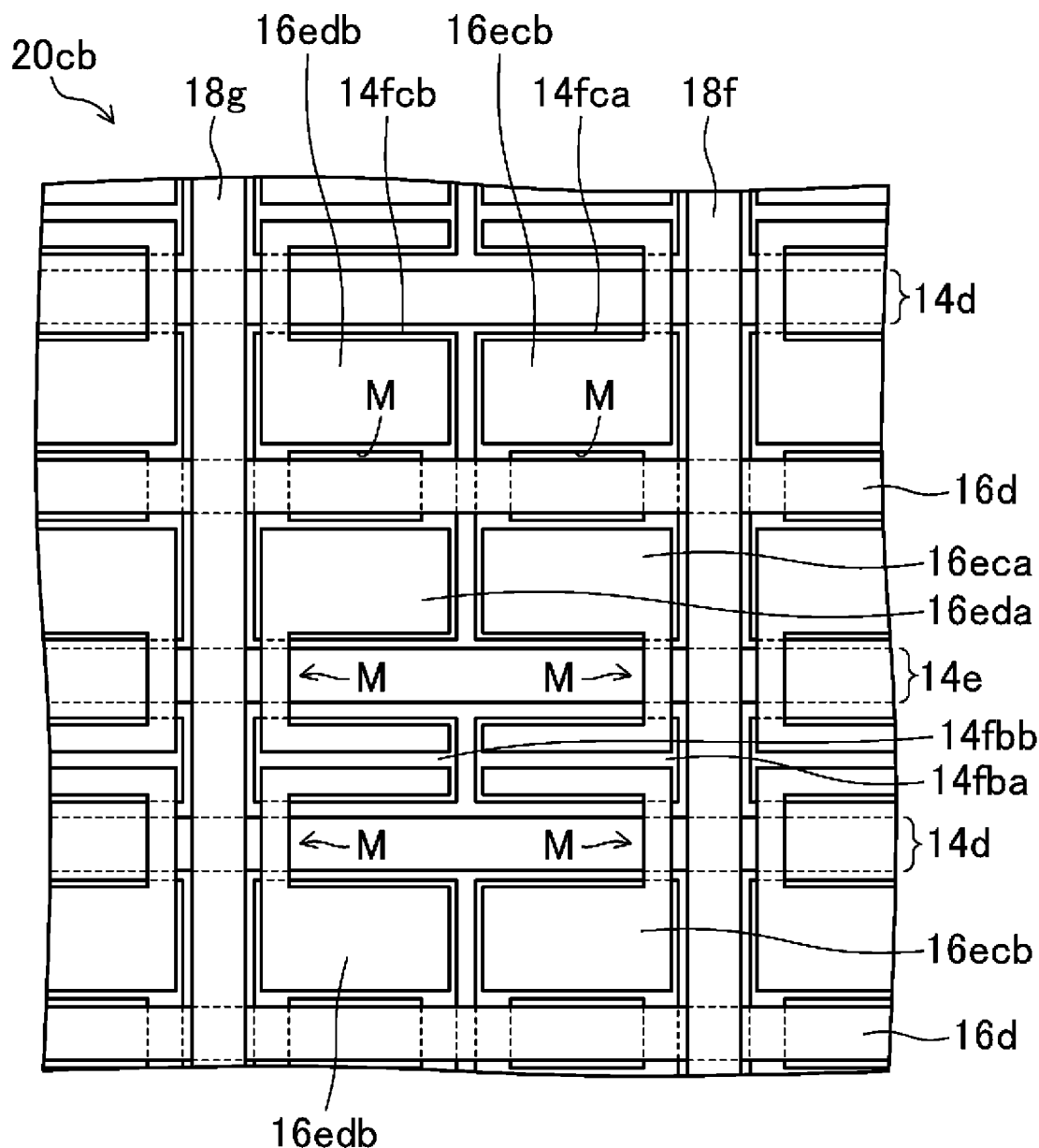
FIG. 19 is a plan view of the second modified example of the TFT layer included in the organic EL display device according to the third embodiment of the disclosure.

FIGS. 14 to 19 illustrate a third embodiment of the display device according to the disclosure. Here, FIG. 14 is a plan view of a TFT layer 20c included in an organic EL display device of the present embodiment. Additionally, FIGS. 15 and 16 are cross-sectional views of the TFT layer 20c taken along a line XV-XV and a line XVI-XVI in FIG. 14. FIG. 17 is a plan view of a TFT layer 20ca, which is a first modified example of the TFT layer 20c. FIG. 18 is a cross-sectional view of the TFT layer 20ca taken along a line XVIII-XVIII in FIG. 17. FIG. 19 is a plan view of a TFT layer 20cb, which is a second modified example of the TFT layer 20c.

In the first embodiment described above, the organic EL display device 50a, including the TFT layer 20a that is provided with the first metal layers 14fa and 14fb along the source line 18f and the power source line 18g that are adjacent to each other, is illustrated. In the present embodiment, the organic EL display device, including the TFT layer 20c that is provided with the first metal layers 14fa and 14fb and the second metal layer 16e along the source line 18f and the power source line 18g that are adjacent to each other, will be exemplified.

The organic EL display device of the present embodiment, like the organic EL display device 50a of the first embodiment described above, includes the display region D and the frame region F that is provided on the periphery of the display region D.

As with the organic EL display device 50a of the first embodiment described above, the organic EL display device of the present embodiment includes the resin substrate layer 10, the TFT layer 20c that is provided on the resin substrate layer 10, the organic EL element 25 that is provided on the TFT layer 20c, and the sealing film 30 that is provided to cover the organic EL element 25.

Similar to the TFT layer 20a according to the first embodiment described above, the TFT layer 20c includes the base coat film 11 that is provided on the resin substrate layer 10, the plurality of first TFTs 9a, the plurality of second TFTs 9b, the plurality of third TFTs 9c, and the plurality of capacitors 9d that is provided on the base coat film 11, and the flattening film 19a is provided on each of the first TFTs 9a, each of the second TFTs 9b, each of the third TFTs 9c, and each of the capacitors 9d.

In the TFT layer 20c, similar to the TFT layer 20a according to the first embodiment described above, the base coat film 11, the semiconductor film, the gate insulating film (first inorganic insulating film) 13, the first metal film, the first interlayer insulating film (second inorganic insulating film) 15, the second metal film, the second interlayer insulating film 17, the third metal film, and the flattening film 19a are sequentially layered on the resin substrate layer 10.

In the TFT layer 20c, as illustrated in FIG. 14, in the display region D, the plurality of gate lines 14d is provided by the first metal film as the first wiring lines, and the plurality of gate lines 14d extendsparallel to each other and in the horizontal direction in the figure. In addition, in the TFT layer 20c, as illustrated in FIG. 14, in the display region D, the plurality of light emission control lines 14e is provided by the first metal film as the first wiring lines, and the plurality of light emission control lines 14e extendsparallel to each other and in the horizontal direction in the figure. Note that, as illustrated in FIG. 14, each of the light emission control lines 14e is provided adjacent to each of the gate lines 14d. In the TFT layer 20c, as illustrated in FIG. 14, in the display region D, the plurality of initialization power source lines 16d is provided by the second metal film as the second wiring lines, and the plurality of initialization power source lines 16d extendsparallel to each other and in the extending direction (horizontal direction in the figure) of each of the gate lines 14d. Further, in the TFT layer 20c, as illustrated in FIG. 14, in the display region D, the plurality of source lines 18f is provided by the third metal film as the third wiring lines, and the plurality of source lines 18f extendsparallel to each other and in a direction orthogonal to each of gate lines 14d (vertical direction in the figure). Further, in the TFT layer 20c, as illustrated in FIG. 14, in the display region D, the plurality of power source lines 18g is provided by the third metal film as the third wiring lines, and the plurality of power source lines 18g extendsparallel to each other and in the vertical direction in the figure. Note that, as illustrated in FIG. 14, each of the power source lines 18g is provided adjacent to each of the source lines 18f. In addition, in the TFT layer 20c, similar to the TFT layer 20a according to the first embodiment described above, each subpixel P includes the first TFT 9a, the second TFT 9b, the third TFT 9c, and the capacitor 9d.

In the TFT layer 20c, as illustrated in FIGS. 14 to 16, the first metal layers 14fa and 14fb that are formed by the first metal film are provided in rectangular island shapes along the source line 18f and the power source line 18g that are adjacent to each other, and the the first metal layers 14fa and 14fb overlap a region surrounded by the source line 18f and the power source line 18g that are adjacent to each other and the gate line 14d and the light emission control line 14e that are adjacent to each other. Note that as illustrated in FIGS. 14 and 16, the first metal layer 14fa overlaps the initialization power source line 16d via the first interlayer insulating film 15. Further, in the TFT layer 20c, as illustrated in FIGS. 14 to 16, the second metal layer 16e that is formed by the second metal film is provided in a rectangular island shape along the source line 18f and the power source line 18g that are adjacent to each other, and the second metal layer 16e overpass a region surrounded by the source line 18f and the power source line 18g that are adjacent to each other and the pair of initialization power source lines 16d that is adjacent to each other. Here, as illustrated in FIG. 16, the first metal layers 14fa and 14fb and the second metal layer 16e overlap with each other via the first interlayer insulating film 15. Additionally, as illustrated in FIGS. 14 and 16, the second metal layer 16e overlaps the gate line 14d and the light emission control line 14e via the first interlayer insulating film 15. Further, as illustrated in FIG. 15, side-end portions of the source line 18f and the power source line 18g overlap the inclined portions S of the first interlayer insulating film 15 that is formed covering the end portions of the first metal layer 14fa (14fb) and the inclined portions S of the second interlayer insulating film 17 that is formed covering the end portions of the second metal layer 16e. Then, the heights of the upper faces of the source line 18f and the power source line 18g are close to the height of the upper face of the second interlayer insulating film 17 on the second metal layer 16e between the source line 18f and the power source line 18g. Note that in the present embodiment, the TFT layer 20c, in which one island-shaped first metal layer 14fa (14fb) is provided in the region that is surrounded by the source line 18f and the power source line 18g that are adjacent to each other and the gate line 14d and the light emission control line 14e that are adjacent to each other, and one island-shaped second metal layer 16e is provided in the region that is surrounded by the source line 18f and the power source line 18g that are adjacent to each other and the pair of initialization power source lines 16d that are adjacent to each other, is exemplified. However, the TFT layer 20ca, as illustrated in FIGS. 17 and 18 and the TFT layer 20cb as illustrated in FIG. 19, are also applicable.

Specifically, in the TFT layer 20ca, as illustrated in FIG. 17, the first metal layer 14fa of the TFT layer 20c (see FIG. 14) is divided into a plurality of (e.g., two) portions, which are first metal layers 14faa and 14fab, and the first metal layer 14fb of the TFT layer 20c (see FIG. 14) is divided into a plurality of (e.g., two) portions, which are first metal layers 14fba and 14fbb. Further, in the TFT layer 20ca, the second metal layer 16e of the TFT layer 20c (see FIG. 14) is divided into a plurality of (e.g., two) portions, which are second metal layers 16ec and 16ed.

Furthermore, in the TFT layer 20cb, as illustrated in FIG. 19, the first metal layers 14faa and 14fab of the TFT layer 20ca (see FIG. 17) are modified to first metal layers 14fca and 14fcb provided with openings M that are extending through, overlapping the initialization power source line 16d, respectively. Additionally, in the TFT layer 20cb, as illustrated in FIG. 19, the second metal layer 16ec of the TFT layer 20ca (see FIG. 17) is divided into a plurality of (e.g., two) portions, which are second metal layers 16eca and 16ecb that are provided with openings Mextending through, have cutting out circumferential-end portions, and overlap with the gate line 14d and the light emission control line 14e, respectively. Also, in the TFT layer 20cb, as illustrated in FIG. 19, the second metal layer 16ed of the TFT layer 20ca (see FIG. 17) is divided into a plurality of (e.g., two) portions, which are second metal layers 16eda and 16edb that are provided with openings M, extending through, have cutting out circumferential-end portions, and overlap with the gate line 14d and the light emission control line 14e, respectively.

As with the organic EL display device 50a of the first embodiment described above, the organic EL display device that is provided with the TFT layer 20c of the present embodiment has flexibility and is configured to display an image by causing the light-emitting layer 3 of the organic EL layer 23 to emit light as appropriate via the first TFT 9a, the second TFT 9b, and the third TFT 9c in each subpixel P.

The organic EL display device that is provided with the TFT layer 20c of the present embodiment can be manufactured, in the TFT layer forming process of the method for manufacturing the organic EL display device 50a as described in the first embodiment, by additionally forming the second metal layer 16e between the pair of initialization power source lines 16d adjacent to each other that are simultaneously formed when the upper conductive layer 16 of the capacitor 9d is formed.

As described above, according to the organic EL display device that is provided with the TFT layer 20c of the present embodiment, the first metal layers 14fa and 14fb that are formed by the first metal film are provided in the island shapes along the source line 18f and the power source line 18g that are adjacent to each other, and the first metal layers 14fa and 14fb overlap the region surrounded by the source line 18f and the power source line 18g that are adjacent to each other and the gate line 14d and the light emission control line 14e that are adjacent to each other. Further, the second metal layer 16e that is formed by the second metal film is provided in the island shape along the source line 18f and the power source line 18g that are adjacent to each other, and the second metal layer 16e overlaps the region surrounded by the source line 18f and the power source line 18g that are adjacent to each other and the pair of initialization power source lines 16d that is adjacent to each other. Consequently, the heights of the upper faces of the source line 18f and the power source line 18g become close to the height of the upper face of the second interlayer insulating film 17 between the source line 18f and the power source line 18g. Therefore, the thicknesses of the resist film R on the source line 18f and the power source line 18g can be close to the thickness of the resist film R on the second interlayer insulating film 17 between the source line 18f and the power source line 18g. As a result, the shortage of exposure amount to the resist film R that is on the second interlayer insulating film 17 between the source line 18f and the power source line 18g is solved. Thus, the film residue of the resist film R between the source line 18f and the power source line 18g can be suppressed.

Fourth Embodiment

Figure 20:
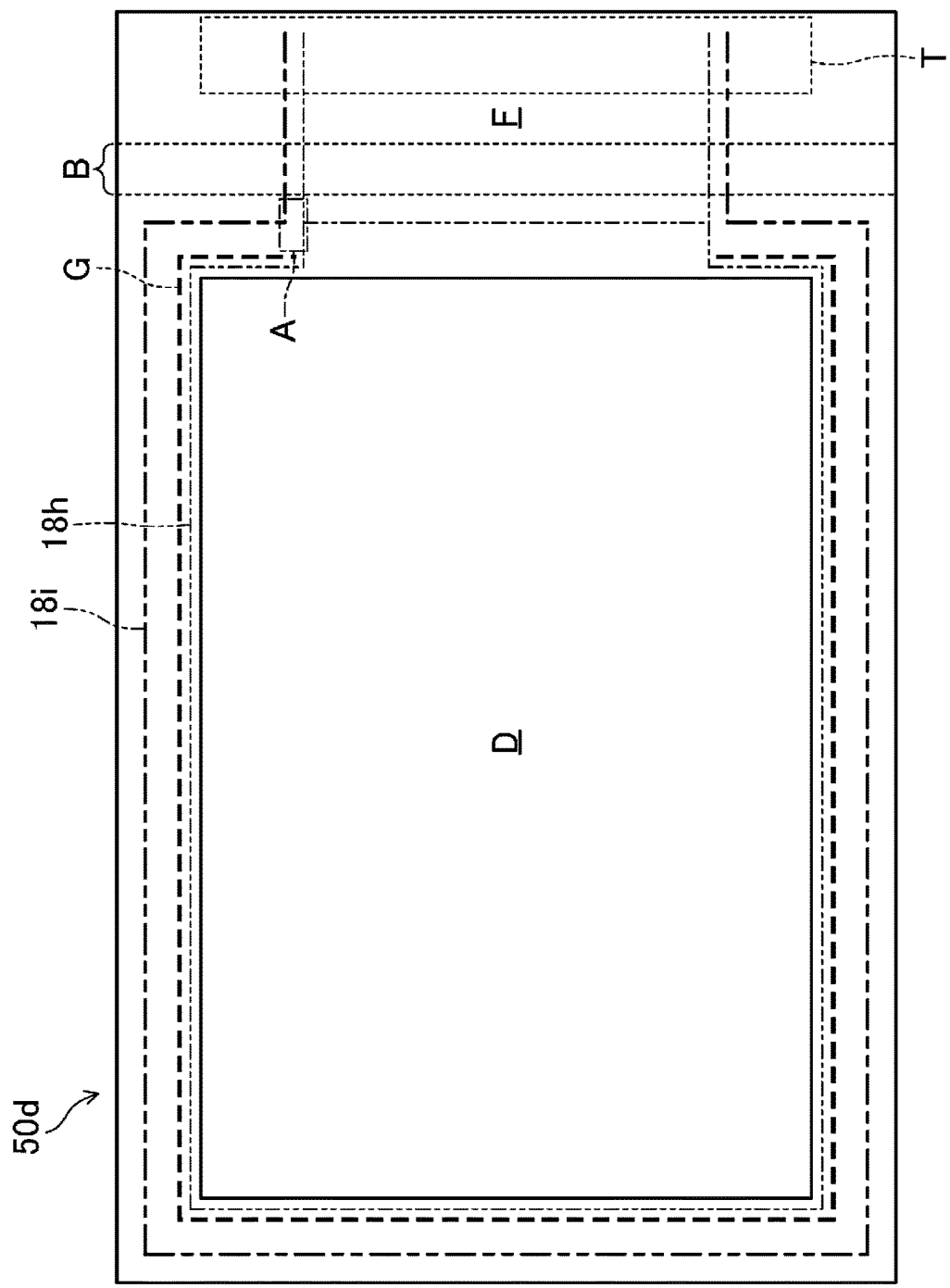
FIG. 20 is a plan view illustrating a schematic configuration of an organic EL display device according to a fourth embodiment of the disclosure.
Figure 21:
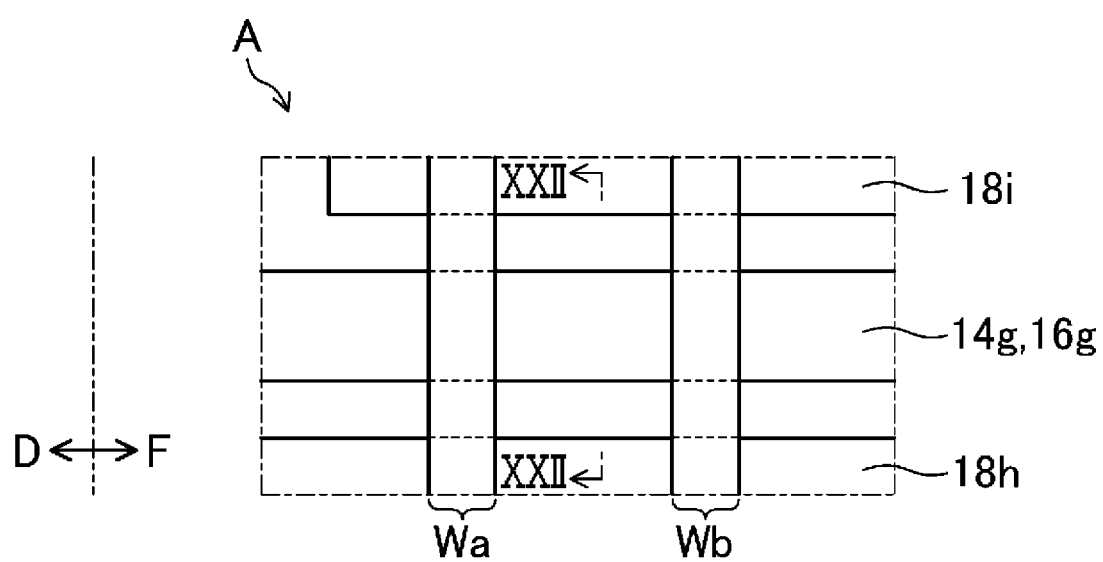
FIG. 21 is an enlarged plan view of main portions of a region A of FIG. 20.
Figure 22:
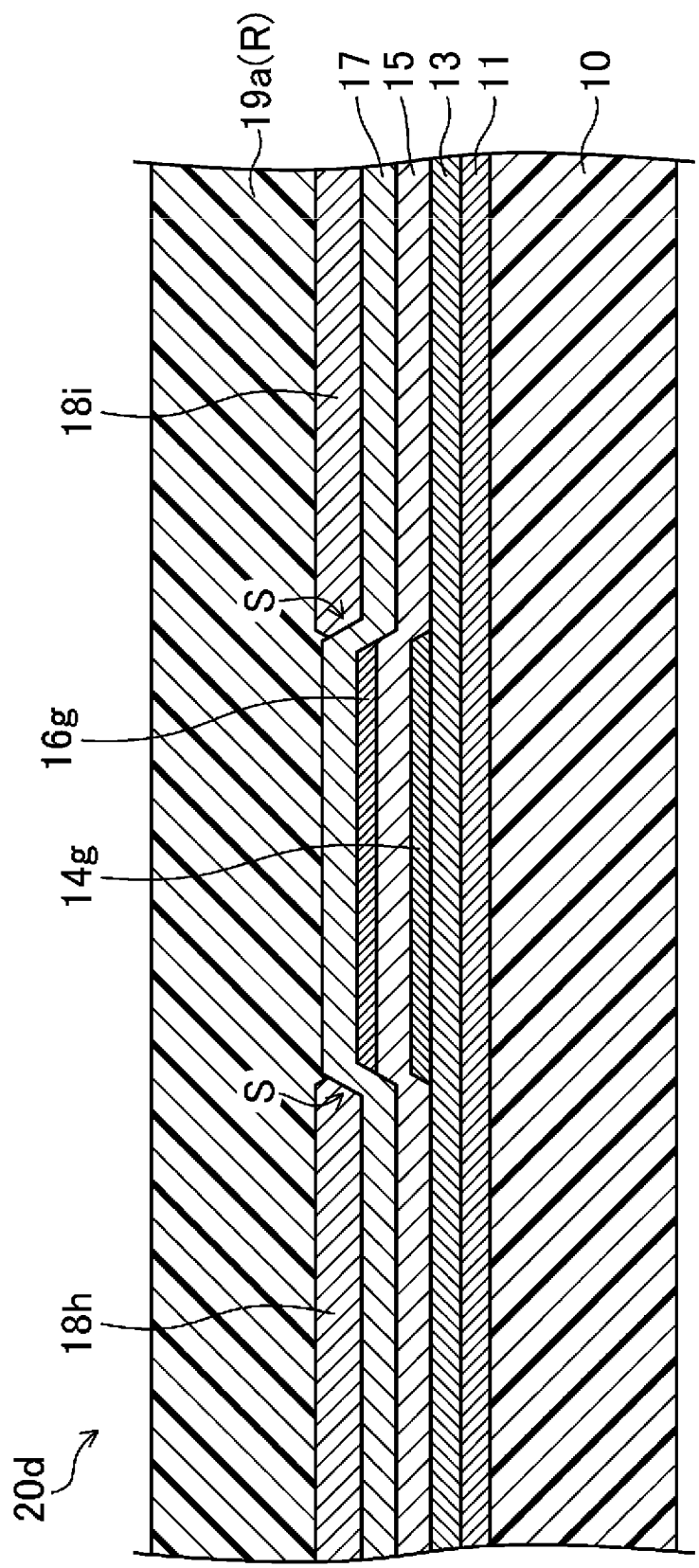
FIG. 22 is a cross-sectional view of a TFT layer included in the organic EL display device according to the fourth embodiment of the disclosure taken along a line XXII-XXII in FIG. 21.

FIG. 20 to FIG. 22 illustrate a fourth embodiment of the display device according to the disclosure. Here, FIG. 20 is a plan view illustrating a schematic configuration of an organic EL display device 50d according to the present embodiment. FIG. 21 is an enlarged plan view of main portions of a region A of FIG. 20. FIG. 22 is a cross-sectional view of a TFT layer 20d included in the organic EL display device 50d taken along a line XXII-XXII in FIG. 21.

In each of the embodiments described above, the organic EL display device (50a), in which the film residue of the resist film R that is between the wiring lines provided in the display region D is suppressed, is illustrated. In the present embodiment, the organic EL display device 50d, in which the film residue of the resist film R that is between the wiring lines provided in the frame region F is suppressed, is illustrated.

As illustrated in FIG. 20, the organic EL display device 50d has substantially the same configuration as the organic EL display device 50a of the first embodiment described above (see FIG. 1). Therefore, the detailed configurations of the first frame wiring line 18h and the second frame wiring line 18i omitted in the first embodiment will be described below.

In the organic EL display device 50d, as illustrated in FIG. 21, the first frame wiring line 18h and the second frame wiring line 18i are provided adjacent to each other between the first dam wall Wa and the second dam wall Wb. Here, between the first frame wiring line 18h and second frame wiring line 18i that are adjacent to each other, as illustrated in FIGS. 21 and 22, a third metal layer 14g that is formed by the first metal film and a fourth metal layer 16g that is formed by the second metal film are provided in island shapes along the first frame wiring line 18h and the second frame wiring line 18i. Note that the third metal layer 14g and the fourth metal layer 16g overlap with each other via the first interlayer insulating film 15, as illustrated in FIG. 22. further, as illustrated in FIG. 22, side-end portions of the first frame wiring line 18h and second frame wiring line 18i that are adjacent to each other overlap the inclined portions S of the first interlayer insulating film 15 that is formed covering the end portions of the third metal layer 14g and the inclined portions S of the second interlayer insulating film 17 that is formed covering the end portions of the fourth metal layer 16g. Then, the heights of the upper faces of the first frame wiring line 18h and the second frame wiring line 18i are close to the height of the upper face of the second interlayer insulating film 17 on the fourth metal layer 16g between the first frame wiring line 18h and the second frame wiring line 18i.

Note that in the present embodiment, the configuration, in which the third metal layer 14g and the fourth metal layer 16g are provided between the first frame wiring line 18h and second frame wiring line 18i that are adjacent to each other, is exemplified. However, the configuration may be adopted in which one of the third metal layer 14g and the fourth metal layer 16g is provided between the first frame wiring line 18h and the second frame wiring line 18i that re adjacent to each other.

As with the organic EL display device 50a of the first embodiment described above, the organic EL display device 50d of the present embodiment has flexibility and is configured to display an image by causing the light-emitting layer 3 of the organic EL layer 23 to emit light as appropriate via the first TFT 9a, the second TFT 9b, and the third TFT 9c in each subpixel P.

The organic EL display device 50d of the present embodiment can be manufactured, in the TFT layer forming process of the method for manufacturing the organic EL display device 50a as described in the first embodiment, by forming the third metal layer 14g when forming the gate electrode 14a and the like of the first TFT 9a, and forming the fourth metal layer 16g when forming the upper conductive layer 16 of the capacitor 9d.

As described above, according to the organic EL display device 50d of the present embodiment, between the first frame wiring line 18h and the second frame wiring line 18i that are adjacent to each other and between the first dam wall Wa and the second dam wall Wb, the third metal layer 14g that is formed by the first metal film and the fourth metal layer 16g that is formed by the second metal film are provided in the island shapes along the first frame wiring line 18h and the second frame wiring line 18i, respectively. Consequently, the heights of the upper faces of the first frame wiring line 18*h* and the second frame wiring line 18*i* that are adjacent to each other become close to the height of the upper face of the second interlayer insulating film 17 between the first frame wiring line 18*h* and the second frame wiring line 18*i*. Therefore, the thicknesses of the resist film R on the first frame wiring line 18*h* and the second frame wiring line 18*i* may become close to the thickness of the resist film R on the second interlayer insulating film 17 between the first frame wiring line 18*h* and the second frame wiring line 18*i*. As a result, the shortage of exposure amount to the resist film R that is on the second interlayer insulating film 17 between the first frame wiring line 18*h* and the second frame wiring line 18*i* is solved. Thus, the film residue of the resist film R between the first frame wiring line 18*h* and the second frame wiring line 18*i* can be suppressed.

Other Embodiments

In each of the embodiments described above, the first metal layer, the second metal layer, the third metal layer, and the fourth metal layer are provided in electrically floating states. However, the first metal layer, the second metal layer, the third metal layer, and the fourth metal layer may be formed with contact holes in the corresponding inorganic insulating films and be electrically connected to the overlapping wiring lines to suppress the generation of parasitic capacitance with the overlapping wiring lines.

In each of the embodiments described above, the organic EL layer, having a five-layer structure including the hole injection layer, the hole transport layer, the light-emitting layer, the electron transport layer, and the electron injection layer, is exemplified. The organic EL layer may have a three-layer structure including a hole injection-cum-transport layer, a light-emitting layer, and an electron transport-cum-injection layer.

In each of the embodiments described above, the organic EL display device, including the first electrode as an anode and the second electrode as a cathode, is exemplified. The disclosure is also applicable to an organic EL display device in which the layered structure of the organic EL layer is in a reverse order with the first electrode being a cathode and the second electrode being an anode.

In the above-described embodiments, the example of the organic EL display device, in which the electrode of the TFT that is connected to the first electrode serves as the drain electrode, is provided. However, the disclosure is also applicable to an organic EL display device in which the electrode of the TFT that is connected to the first electrode is referred to as the source electrode.

In each of the embodiments described above, the organic EL display device is exemplified and described as a display device. The disclosure is also applicable to a display device including a plurality of light-emitting elements that is driven by an electrical current. For example, the disclosure is applicable to a display device including Quantum-dot light emitting diodes (QLEDs) that are light-emitting elements using a quantum dot-containing layer.

INDUSTRIAL APPLICABILITY

As described above, the disclosure is useful for a flexible display device.

REFERENCE SIGNS LIST

D Display region
F Frame region
M Opening
Wa First dam wall
Wb Second dam wall
10 Resin substrate layer (base substrate)
13 Gate insulating film (first inorganic insulating film)
14*d* Gate line (first wiring line)
14*e* Light emission control line (first wiring line)
14*fa*, 14*faa*, 14*fab*, 14*fb*, 14*fba* 14*fbb*, 14*fc*, 14*fca*, 14*fcb* First metal layer
14*g* Third metal layer
15 First interlayer insulating film (second inorganic insulating film)
16*d* Initialization power source line (second wiring line)
16*e*, 16*ea*, 16*eb*, 16*ec*, 16*eca*, 16*ecb*, 16*ed*, 16*eda*, 16*edb* Second metal layer
16*g* Fourth metal layer
17 Second interlayer insulating film (third inorganic insulating film)
18*f* Source line (third wiring line)
18*g* Power source line (third wiring line)
18*h* First frame wiring line
18*i* Second frame wiring line
20*a*, 20*b*, 20*ba*, 20*c*, 20*ca*, 20*cb*, 20*d* TFT layer
25 Organic EL element (light-emitting element)
26 First inorganic film
27 Organic film
28 Second inorganic film
30 Sealing film
50*a*, 50*d* Organic EL display device

The invention claimed is:

1. A display device comprising:
a base substrate;
a thin-film transistor (TFT) layer provided on the base substrate and formed by sequentially layering a first inorganic insulating film, a first metal film, a second inorganic insulating film, a second metal film, a third inorganic insulating film, and a third metal film;
a light-emitting element provided on the TFT layer and included in a display region;
a plurality of first wiring lines provided by the first metal film and extending parallel to each other in the display region;
a plurality of second wiring lines provided by the second metal film and extending parallel to each other in an extending direction of each of the plurality of first wiring lines in the display region;
a plurality of third wiring lines provided by the third metal film and extending parallel to each other in a direction intersecting each of the plurality of first wiring lines in the display region;
a frame region provided around the display region;
a sealing film provided covering the light-emitting element and in which a first inorganic film, an organic film, and a second inorganic film are sequentially layered;
a first dam wall provided surrounding the display region in the frame region and overlapping a circumferential end portion of the organic film;
a second dam wall provided surrounding the first dam wall in the frame region;
a first frame wiring line provided in the frame region, formed by the third metal film, and to which a high power supply voltage is input; and
a second frame wiring line provided in the frame region, formed by the third metal film, and to which a low power supply voltage is input, wherein a first metal layer that is formed by the first metal film is provided in an island shape along a pair of third wiring lines, among the plurality of third wiring lines, that is adjacent to each other, the first metal layer overlaps a region that is surrounded by the pair of third wiring lines adjacent to each other and a pair of first wiring lines, among the plurality of first wiring lines, that is adjacent to each other, the first frame wiring line and the second frame wiring line are provided adjacent to each other between the first dam wall and the second dam wall, and between the first frame wiring line and the second frame wiring line that are adjacent to each other, a third metal layer that is formed by the first metal film is provided in an island shape along the first frame wiring line and the second frame wiring line.

2. The display device according to claim 1,
wherein a side end portion of each of the plurality of third wiring lines is provided overlapping inclined portions of the second inorganic insulating film that is formed to cover an end portion of the first metal layer, and overlapping inclined portions of the third inorganic insulating film.

3. The display device according to claim 1,
wherein in the first metal layer, an opening extending through the first metal layer overlaps each of the plurality of second wiring lines.

4. The display device according to claim 3,
wherein the opening includes a cut out portion at the circumferential end of the first metal layer.

5. The display device according to claim 1,
wherein the first metal layer is divided into a plurality of portions in the region that is surrounded by the pair of third wiring lines adjacent to each other and the pair of first wiring lines adjacent to each other.

6. The display device according to claim 1,
wherein a second metal layer that is formed by the second metal film is provided in an island shape along the pair of third wiring lines adjacent to each other, and the second metal layer overlaps a region that is surrounded by the pair of third wiring lines adjacent to each other and a pair of second wiring lines, among the plurality of second wiring lines, that is adjacent to each other, and the first metal layer and the second metal layer overlap each other via the second inorganic insulating film.

7. The display device according to claim 6,
wherein a side end portion of each of the plurality of third wiring lines overlaps an inclined portion of the third inorganic insulating film that is formed to cover an end portion of the second metal layer.

8. The display device according to claim 7,
wherein the second metal layer is divided into a plurality of portions in the region that is surrounded by the pair of third wiring lines adjacent to each other and the pair of second wiring lines adjacent to each other.

9. The display device according to claim 6,
wherein in the second metal layer, an opening extending through the second metal layer overlaps each of the plurality of first wiring lines.

10. A display device comprising:
a base substrate;
a thin-film transistor (TFT) layer provided on the base substrate and formed by sequentially layering a first inorganic insulating film, a first metal film, a second inorganic insulating film, a second metal film, a third inorganic insulating film, and a third metal film;

a light-emitting element provided on the TFT layer and included in a display region;
a plurality of first wiring lines provided by the first metal film and extending parallel to each other in the display region;
a plurality of second wiring lines provided by the second metal film and extending parallel to each other in an extending direction of each of the plurality of first wiring lines in the display region;
a plurality of third wiring lines provided by the third metal film and extending parallel to each other in a direction intersecting each of the plurality of first wiring lines in the display region;
a frame region provided around the display region;
a sealing film provided covering the light-emitting element and in which a first inorganic film, an organic film, and a second inorganic film are sequentially layered;
a first dam wall provided surrounding the display region in the frame region and overlapping a circumferential end portion of the organic film;
a second dam wall provided surrounding the first dam wall in the frame region;
a first frame wiring line provided in the frame region, formed by the third metal film, and to which a high power supply voltage is input; and
a second frame wiring line provided in the frame region, formed by the third metal film, and to which a low power supply voltage is input,
wherein a second metal layer that is formed by the second metal film is provided in an island shape along a pair of third wiring lines, among the plurality of third wiring lines, that is adjacent to each other,
the second metal layer overlaps a region that is surrounded by the pair of third wiring lines adjacent to each other and a pair of second wiring lines, among the plurality of second wiring lines, that is adjacent to each other,
the first frame wiring line and the second frame wiring line are provided adjacent to each other between the first dam wall and the second dam wall, and
between the first frame wiring line and the second frame wiring line that are adjacent to each other, a third metal layer that is formed by the first metal film is provided in an island shape along the first frame wiring line and the second frame wiring line.

11. The display device according to claim 10,
wherein a side end portion of each of the plurality of third wiring lines overlaps an inclined portion of the third inorganic insulating film that is formed to cover an end portion of the second metal layer.

12. The display device according to claim 10,
wherein the second metal layer is divided into a plurality of portions in the region that is surrounded by the pair of third wiring lines adjacent to each other and the pair of second wiring lines adjacent to each other.

13. The display device according to claim 1,
wherein side end portions, of the first frame wiring line and the second frame wiring line adjacent to each other, are provided overlapping inclined portions of the second inorganic insulating film that is formed to cover end portions of the third metal layer, and overlapping inclined portions of the third inorganic insulating film.

14. The display device according to claim 1,
wherein between the first frame wiring line and the second frame wiring line that are adjacent to each other, a fourth metal layer that is formed by the second metal film is provided in an island shape along the first frame wiring line and the second frame wiring line, and the third metal layer and the fourth metal layer overlap each other via the second inorganic insulating film.

15. The display device according to claim 14,
wherein side end portions, of the first frame wiring line and the second frame wiring line adjacent to each other, are provided overlapping inclined portions of the third inorganic insulating film that is formed to cover end portions of the fourth metal layer.

16. A display device comprising:
a base substrate;
a thin-film transistor (TFT) layer provided on the base substrate and formed by sequentially layering a first inorganic insulating film, a first metal film, a second inorganic insulating film, a second metal film, a third inorganic insulating film, and a third metal film;
a light-emitting element provided on the TFT layer and included in a display region;
a plurality of first wiring lines provided by the first metal film and extending parallel to each other in the display region;
a plurality of second wiring lines provided by the second metal film and extending parallel to each other in an extending direction of each of the plurality of first wiring lines in the display region;
a plurality of third wiring lines provided by the third metal film and extending parallel to each other in a direction intersecting each of the plurality of first wiring lines in the display region;
a frame region provided around the display region;
a sealing film provided covering the light-emitting element and in which a first inorganic film, an organic film, and a second inorganic film are sequentially layered;
a first dam wall provided surrounding the display region in the frame region and overlapping a circumferential end portion of the organic film;
a second dam wall provided surrounding the first dam wall in the frame region;
a first frame wiring line provided in the frame region, formed by the third metal film, and to which a high power supply voltage is input; and
a second frame wiring line provided in the frame region, formed by the third metal film, and to which a low power supply voltage is input, wherein a first metal layer that is formed by the first metal film is provided in an island shape along a pair of third wiring lines, among the plurality of third wiring lines, that is adjacent to each other, the first metal layer overlaps a region that is surrounded by the pair of third wiring lines adjacent to each other and a pair of first wiring lines, among the plurality of first wiring lines, that is adjacent to each other, the first frame wiring line and the second frame wiring line are provided adjacent to each other between the first dam wall and the second dam wall, and between the first frame wiring line and the second frame wiring line that are adjacent to each other, a fourth metal layer that is formed by the second metal film is provided in an island shape along the first frame wiring line and the second frame wiring line.

17. The display device according to claim 10,
wherein side end portions, of the first frame wiring line and the second frame wiring line adjacent to each other, are provided overlapping inclined portions of the second inorganic insulating film that is formed to cover end portions of the third metal layer, and overlapping inclined portions of the third inorganic insulating film.

18. The display device according to claim 10,
wherein between the first frame wiring line and the second frame wiring line that are adjacent to each other, a fourth metal layer that is formed by the second metal film is provided in an island shape along the first frame wiring line and the second frame wiring line, and the third metal layer and the fourth metal layer overlap each other via the second inorganic insulating film.

19. The display device according to claim 18,
wherein side end portions, of the first frame wiring line and the second frame wiring line adjacent to each other, are provided overlapping inclined portions of the third inorganic insulating film that is formed to cover end portions of the fourth metal layer.

20. The display device according to claim 16,
wherein a side end portion of each of the plurality of third wiring lines is provided overlapping inclined portions of the second inorganic insulating film that is formed to cover an end portion of the first metal layer, and overlapping inclined portions of the third inorganic insulating film.

* * * * *